US012581685B2

(12) United States Patent
Lin et al.

(10) Patent No.: US 12,581,685 B2
(45) Date of Patent: Mar. 17, 2026

(54) SEMICONDUCTOR DEVICE AND METHOD OF FABRICATING A SEMICONDUCTOR DEVICE

(71) Applicant: Taiwan Semiconductor Manufacturing Company, Ltd., Hsinchu (TW)

(72) Inventors: Yu-Chi Lin, Hsinchu (TW); Yu-Ting Weng, Taichung (TW); Chiung Wen Hsu, Tainan (TW); Chao-Cheng Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 790 days.

(21) Appl. No.: 17/886,433

(22) Filed: Aug. 11, 2022

(65) Prior Publication Data

US 2024/0055526 A1     Feb. 15, 2024

(51) Int. Cl.
| | |
|---|---|
| *H10D 30/62* | (2025.01) |
| *H01L 21/311* | (2006.01) |
| *H10D 30/01* | (2025.01) |
| *H10D 62/10* | (2025.01) |
| *H10D 84/01* | (2025.01) |
| *H10D 84/03* | (2025.01) |

(52) U.S. Cl.
CPC .... *H10D 30/6211* (2025.01); *H01L 21/31116* (2013.01); *H10D 30/024* (2025.01); *H10D 62/115* (2025.01); *H10D 84/0158* (2025.01); *H10D 84/038* (2025.01)

(58) Field of Classification Search
CPC ............ H01L 21/31116; H10D 30/024; H10D 62/115; H10D 84/0158; H10D 84/038
See application file for complete search history.

(56) References Cited

U.S. PATENT DOCUMENTS

| | | | | |
|---|---|---|---|---|
| 2017/0117388 A1* | 4/2017 | Yuan | .................. | H10D 30/6212 |
| 2017/0263504 A1* | 9/2017 | Liou | .................. | H01L 21/3081 |
| 2018/0006111 A1* | 1/2018 | Xie | ....................... | H10D 62/115 |
| 2019/0189519 A1* | 6/2019 | Xu | ....................... | H01L 21/3065 |
| 2021/0098308 A1* | 4/2021 | Yen | .................. | H01L 21/32135 |
| 2022/0230926 A1* | 7/2022 | Huang | .............. | H10D 84/0193 |

* cited by examiner

*Primary Examiner* — Jeff W Natalini
*Assistant Examiner* — Rose Keagy
(74) *Attorney, Agent, or Firm* — JCIPRNET

(57)     ABSTRACT

A semiconductor device and a method of fabricating a semiconductor device are provided herein. The semiconductor device includes a substrate; a fin structure arranged on the substrate and including a ridge portion and a bottom portion between the ridge portion and the substrate, wherein the ridge portion comprises a channel region and a fin region between the channel region and the bottom portion, a critical dimension of the bottom portion in a cross-fin direction is gradually increased toward the substrate to twice or more of a critical dimension of the channel region in the cross-fin direction; a metal gate structure disposed on the fin structure extending the cross-fin direction; and an epitaxy region disposed beside the metal gate structure in a lengthwise direction of the fin structure and connected to the fin structure.

20 Claims, 21 Drawing Sheets

SEMICONDUCTOR DEVICE AND METHOD OF FABRICATING A SEMICONDUCTOR DEVICE

BACKGROUND

Technical Field

The disclosure is related to a semiconductor device and a method of fabricating a semiconductor device.

Description of Related Art

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. As transistor dimensions are continually scaled down to sub 10-15 nm technology nodes, further improvements of the FinFET, for example, a precise critical dimension (CD) control and defect or damage free fin formation processes, are required.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
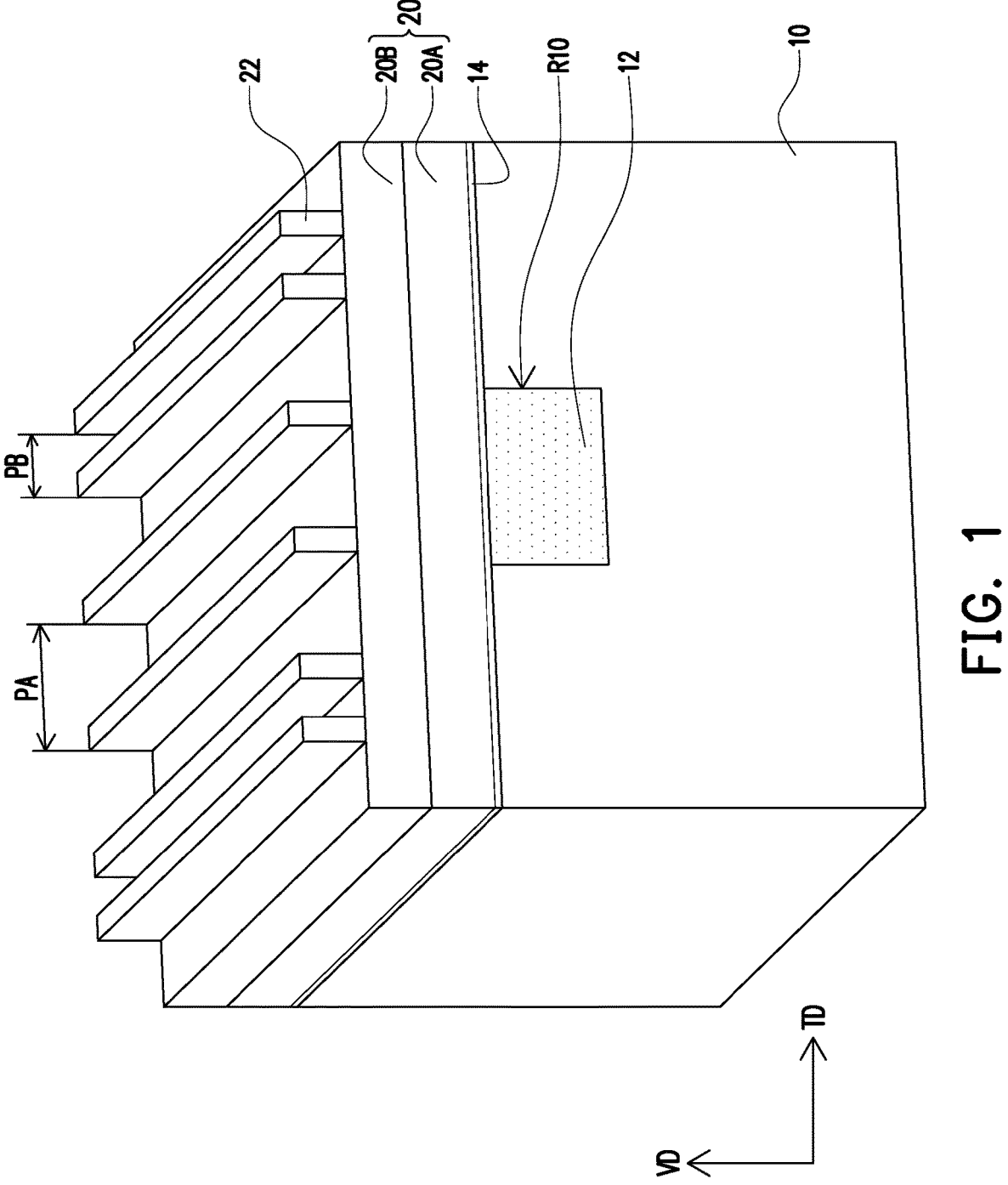
FIGS. 1-4 show a sequential process for fabricating fine structures of a semiconductor device according to an embodiment of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Unless other specified, the same or similar reference numerals in different figures refer to the same or similar component formed by a same or similar process(es) using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-4 show a sequential process for fabricating fine structures of a semiconductor device according to an embodiment of the disclosure. It is understood that additional processes can be provided before, during, and after processes shown by FIGS. 1-4, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted.

In some embodiments, as shown in FIG. 1, a substrate 10 is provided. In some embodiments, the substrate 10 includes a single crystalline semiconductor layer. The substrate may include a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si. The substrate 10 may include various regions that have been suitably doped with impurities (e.g., p-type or n-type conductivity). The dopants are, for example boron ($BF_2$) for an n-type FinFET and phosphorus, arsenic for a p-type FinFET.

In some embodiments, a part of the substrate 10 predetermined to define the p-type region(s) is etched to form a recess R10 by one or more lithography and etching operations. Then, an epitaxial layer 12 is formed in the recess R10 to be embedded in the substrate 10. In some embodiments, the epitaxial layer 12 is made of SiGe. In some embodiments, the germanium concentration of the epitaxial layer 12 is in a range from about 5 atomic % to about atomic %. In some embodiments, one or more buffer layer having a lower Ge concentration than the epitaxial layer 12 is formed between the epitaxial layer 12 and the substrate 10. The epitaxial layer 12 can be formed by chemical vapor deposition (CVD), such as low pressure CVD (LPCVD) and plasma enhanced CVD (PECVD), physical vapor deposition (PVD), atomic layer deposition (ALD), molecular beam epitaxy (MBE), or any other suitable process. In some embodiments, after the epitaxial layer 12 is formed, a CMP operation is performed. The thickness of the epitaxial layer 12 (the depth of the recess R10 formed in the substrate 10) is in a range from about 30 nm to about 100 nm in some embodiments, and is in a range from 40 nm to 80 nm in other embodiments.

In the embodiment, a pad oxide layer 14 made of a silicon oxide can be optionally is formed on the substrate 10 through a thermal oxidation and subsequently, a hard mask layer 20 is formed over the substrate 10. In some embodiments, the mask layer 20 includes a first mask layer 20A and a second mask layer 20B. In some embodiments, the first mask layer 20A includes a silicon nitride layer, and the second mask layer 20B includes a silicon oxide layer. The first and second mask layers 20A and 20B are formed by chemical vapor deposition (CVD), physical vapor deposition (PVD) including sputtering, atomic layer deposition (ALD), or other suitable film formation process.

In some embodiments, the substrate 10 may be patterned to form required structures such as fin structures by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Regarding the double-patterning process, a sacrificial layer may be formed over the substrate 10 and patterned using one or more photolithography and etching processes, to form mandrel patterns (sacrificial patterns). Then, a blanket layer may be formed to cover the mandrel patterns, and anisotropic etching is performed to form sidewall spacers alongside the mandrel patterns using a self-aligned process. Then, the mandrel patterns are removed, and the remaining spacers formed from the blanket layer are used as mask patterns 22 over the mask layer 20. In some embodiments, one or more additional sidewall formation processes are performed to form mask patterns 22 having further reduces pitches. As shown in FIG. 1, the mask patterns 22 are linear patterns, but the disclosure is not limited thereto. In some embodiments, a pitch PA of the mask patterns 22 over the epitaxial layer 12 may be different from a pitch PB of the mask patterns 22 at other regions, but the disclosure is not limited thereto.

Figure 2:
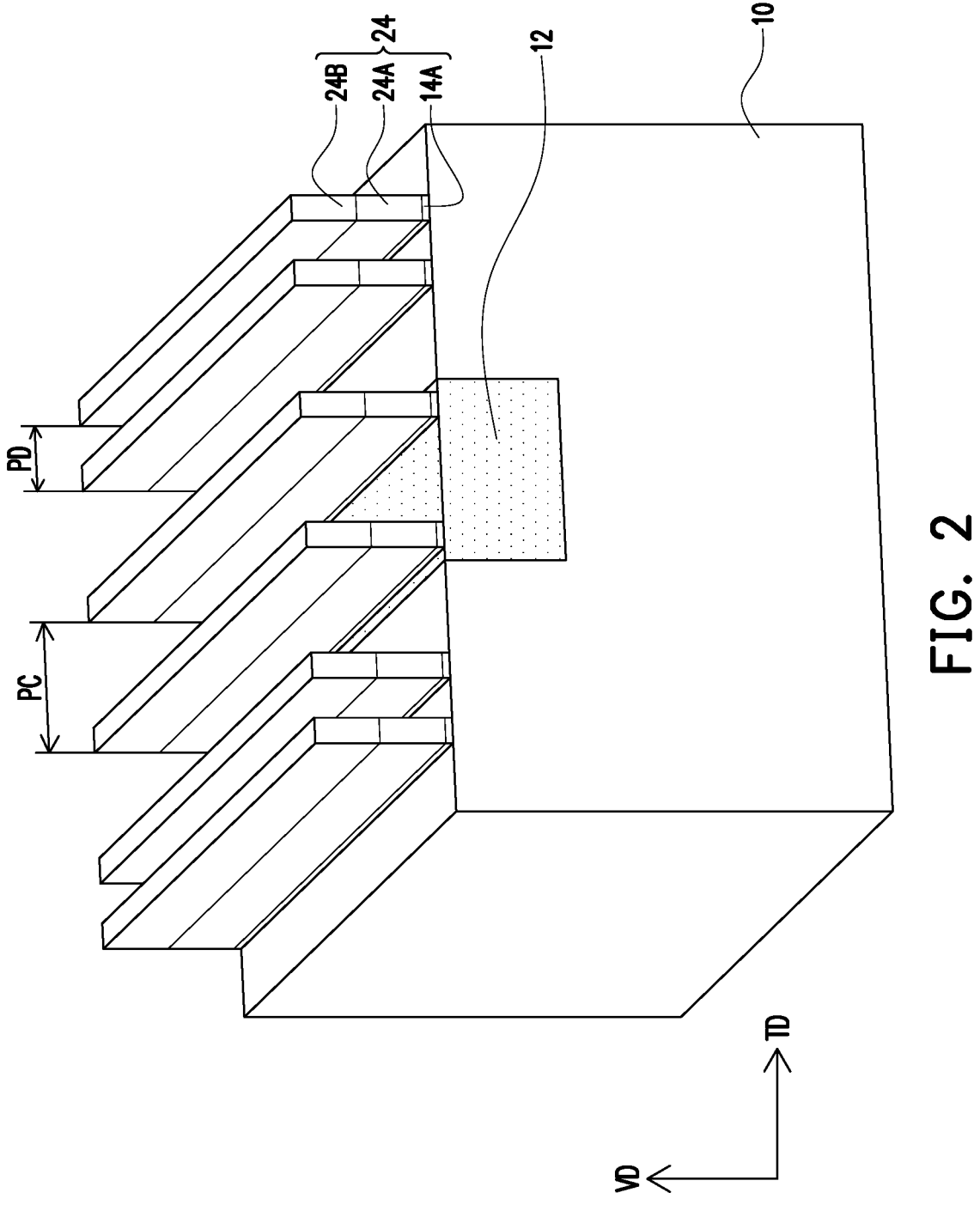

Further, the mask layer 20 and the pad oxide layer 14 are patterned by using one or more etching operations. In some embodiments, the mask layer 20 and the pad oxide layer 14 are patterned using the mask patterns 22 as masks and the mask patterns 22 may be removed after the mask layer 20 and the pad oxide layer 14 are patterned. In addition, the mask layer 20 and/or the pad oxide layer 14 are patterned into mask patterns 24 as shown in FIG. 2 and each of the mask patterns 24 includes the pad oxide pattern 14A patterned from the pad oxide layer 14, the first mask pattern 24A patterned from the first mask layer 20A and the second mask pattern 24B patterned from the second mask layer 20B. In some embodiments, a pitch PC of the mask patterns 24 over the epitaxial layer 12 may be different from a pitch PD of the mask patterns 22 at other regions, but the disclosure is not limited thereto. The pitches PC and PD of the mask patterns 24 may be determined based on various requirements. In some embodiments, a trimming process may be optionally performed to modify the shape of the mask patterns 24, but the disclosure is not limited thereto. In some embodiments, the trimming process may facilitate to maintain the dimension of the subsequent fabricated structures. In some embodiments, the second mask patterns 24B may be reduced under the trimming process. In the subsequent etching operations, the second mask patterns 24B may be gradually removed and thus the following drawings do not show the second mask patterns 24B for illustrative purpose.

Figure 3:
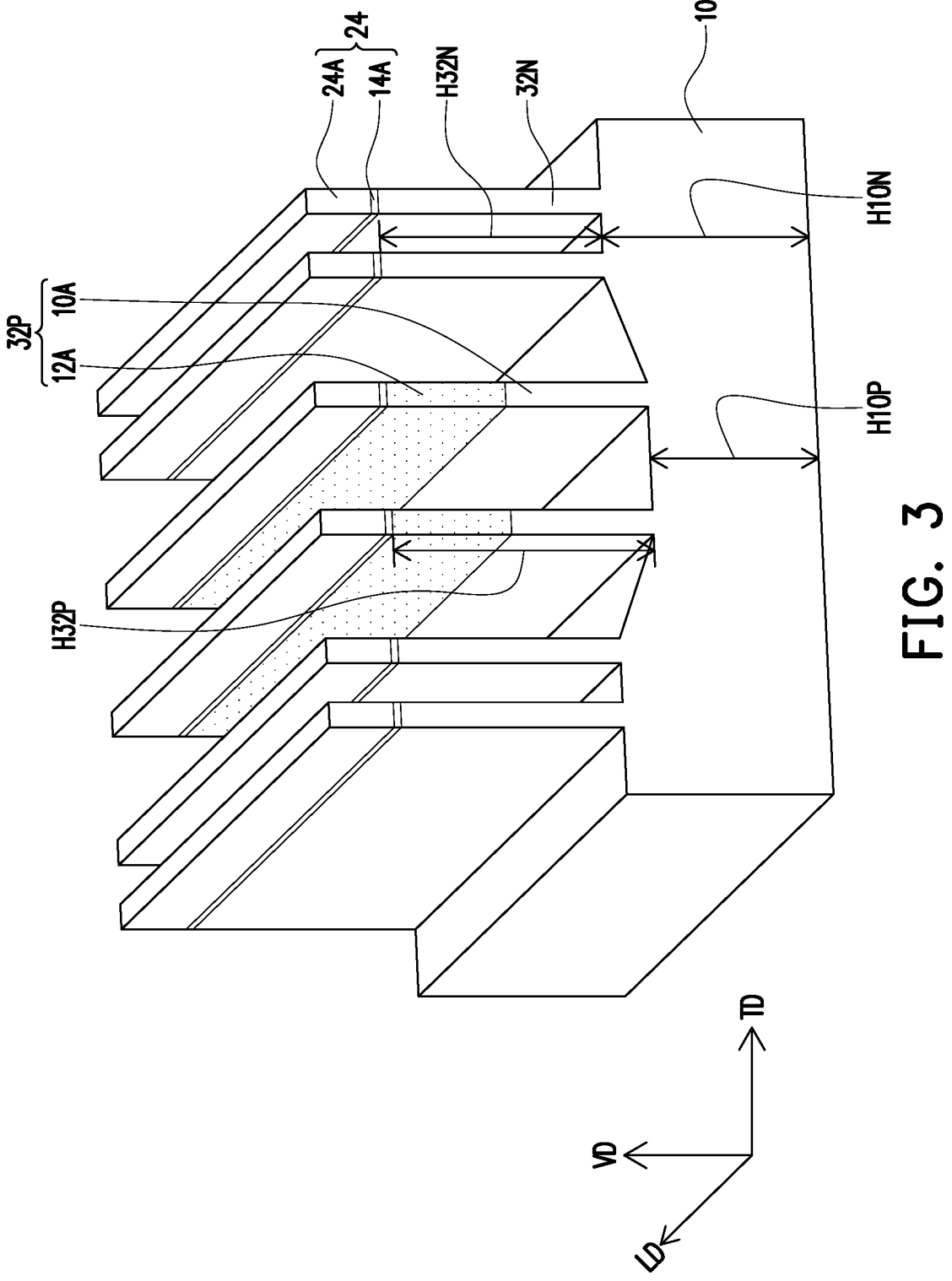

In FIG. 3, a main etching stage of a fin process is performed to pattern the substrate 10 using the mask patterns 24 as etching masks to form a plurality of ridge portions 32N and a plurality of ridge portions 32P arranged in a cross-fin direction TD. In some embodiments, each of the mask patterns 24 includes the pad oxide pattern 14A and the first mask pattern 24A and in some embodiments, each of the mask patterns 24 further includes the second mask pattern 24B. The ridge portions 32N and the ridge portions 32P are protruded from the thinned substrate 10 and extends along lengthwise directions LD intersecting with the cross-fin direction TD to form respective fin-like structures. Specifically, each of the ridge portions 32N may refer to the ridge structures having the same material of the substrate 10, and each of the ridge portions 32P may refer to the ridge structure having an epitaxial section 12A and an intrinsic section 10A. The epitaxial section 12A is patterned from the epitaxial layer 12 embedded in the substrate 10 and the intrinsic section 10A is patterned form a portion of the substrate 10. Therefore, the epitaxial section 12A may be of the material different from the intrinsic section 10A and the ridge portions 32P are the ridge structures having dual sections stacking in the vertical direction VD.

In some embodiments, the rate of removing the material of the epitaxial layer 12 may be different from the rate of removing the material of the substrate 10. Therefore, the height H32P of the ridge portion 32P may be different from the height H32N of the ridge portion 32N. In some embodiments, the height H32P may be greater than the height H32N, but the disclosure is not limited thereto. In addition, the reduced substrate 10 may have a thickness H10P at the region between two ridge portions 32P and a thickness H10N at the region between two ridge portions 32N. The thickness H10P may be smaller than the thickness H10N. In some embodiments, the ridge portions 32N are for an n-type semiconductor device such as an n-type FET, and the ridge portions 32P are for a p-type semiconductor device such as a P-type FET.

Figure 4:
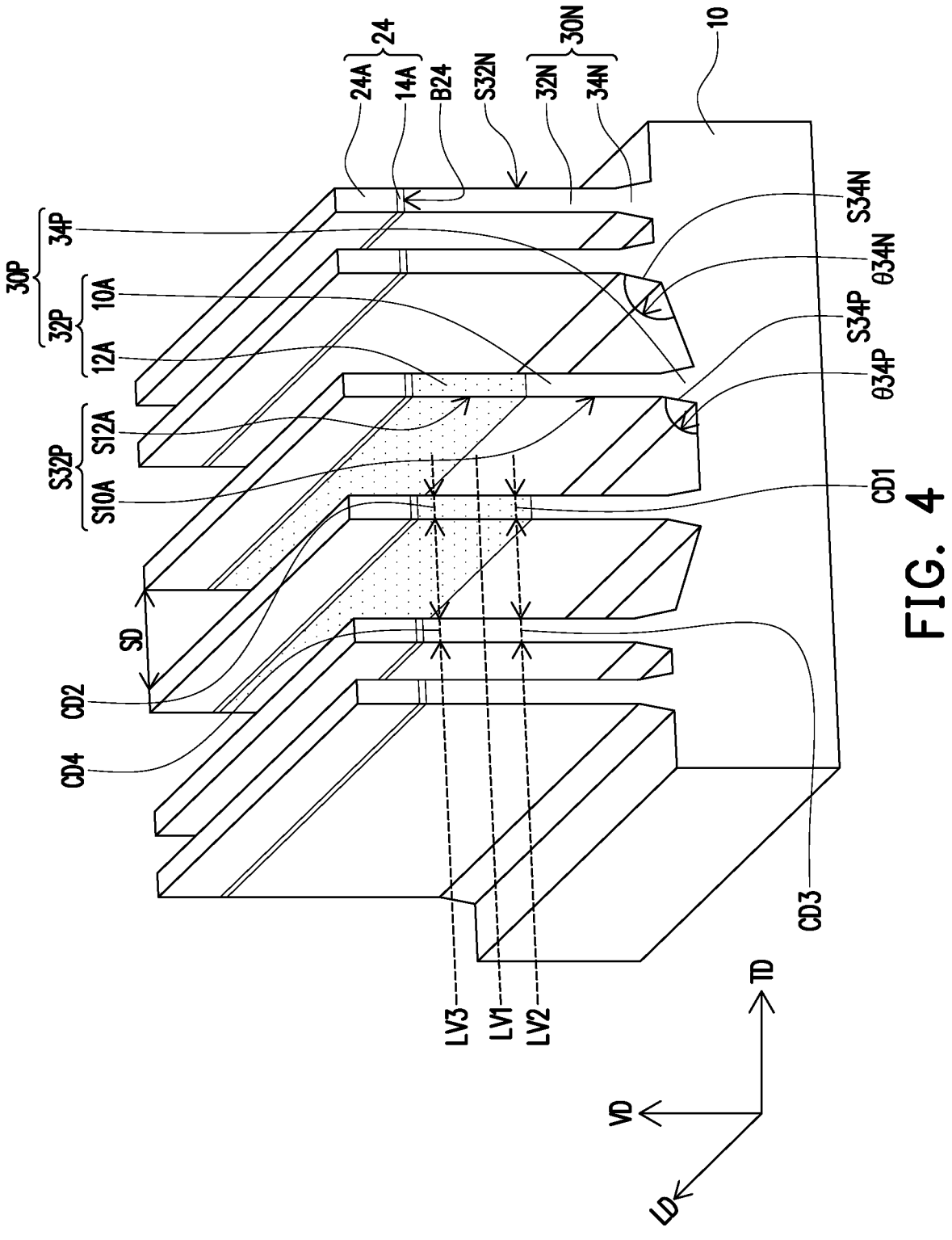

Subsequently, a bottom etching stage of the fin process is performed to further pattern the substrate 10 using the mask patterns 24 as etching masks. The substrate 10 is further reduced under the bottom etching stage to form the bottom portions 34P and the bottom portions 34N. The bottom portions 34P are under the respective ridge portions 32P to form a plurality of fin structures 30P and the bottom portions 34N are under the respective ridge portions 32N to form a plurality of fin structures 30N. In some embodiments, the fin structures 30N are for an n-type FET, and the fin structures 30P are for a p-type FET. FIG. 4 shows two fin structures 30 P and four fin structures 30N, but the quantity of the fin structures 30P and 30N is not limited to two or four and may be as small as one or more. In some embodiments, one or more dummy fin-like structures may be formed on the gaps between two of the fin structures 30P and the fin structures 30N to improve pattern fidelity in the patterning operations.

The bottom etching stage is performed after the main etching stage to further remove a portion of the substrate 10 to fabricate the fin structures 30P and the fin structures 30N. The bottom etching stage and the main etching stage may adopt the same mask patterns 24 as etching masks through different operations and/or parameters. In some embodiments, the main etching stage indicated in FIG. 3 may be performed to obtain a vertical fin-like structure, such as the ridge portions 32P and the ridge portions 32N, with smooth sidewalls and the bottom etching stage in FIG. 4 may be performed to obtain large base structures, such as the bottom portions 34P and the bottom portions 34N, that provide sufficient support to maintain the profiles of the ridge portions 32P and the ridge portions 32N.

In some embodiments, one or more of the ridge portions 32P may have a sidewall S32P which may be divided into a top section sidewall S12A of the epitaxial section 12A and a middle section sidewall S10A of the intrinsic section 10A. The sidewall S32P of the ridge portion 32P may smoothly extend along the vertical direction VD which may be referred to the thickness direction of the substrate 10. The ridge portion 32N may have a sidewall S32N smoothly extending along the vertical direction VD. In some embodiments, a roughness of the sidewalls S32P and S32N may be referred to a distance from the physical outline of a respective sidewall to a reference line measured along the cross-fin direction TD perpendicular to the vertical direction VD, wherein the reference line is a photon line substantially extending in the vertical direction VD and is positioned corresponding to the predetermined outline of the corresponding structure. In some embodiments, the sidewall S32P and the sidewall S32N may have similar roughness since they are fabricated under the same etching process. For example, in the sidewall S32P and the sidewall S32N, a distance from the physical outline to a reference line measured at the portions of the ridge portions 32P and the ridge portions 32N higher than a level LV1 may be from −0.6 nm to 0.3 nm. In some embodiments, the portions of the ridge portions 32P and the ridge portions 32N higher than the level LV1 may be served as channel regions of the finally formed semiconductor device. In some embodiments, the level LV1 may be spaced from the bottom B24 of the mask patterns 24 by about 45 nm, but the disclosure is not limited thereto.

In some embodiments, one or more of the ridge portions 32P and the ridge portions 32N may have a substantially uniformed profile extending in the vertical direction VD. For example, in the ridge portions 32P, a critical dimension CD1 measured at the level LV2 and a critical dimension CD2 measured at the level LV3 are considered, wherein the level LV2 may be spaced from the bottom B24 of the mask patterns 24 by 54 nm and the level LV3 may be spaced from the bottom B24 of the mask patterns 24 by 5 nm. A result of the critical dimension CD1 subtracts the critical dimension CD2 may be from −0.2 nm to 0.2 nm. Accordingly, the ridge portions 32P may have a substantially uniformed width without an obvious variation along the vertical direction VD. In addition, in the ridge portions 32N, a critical dimension CD3 is measured at the level LV2, a critical dimension CD4 is measured at the level LV3, and a result of the critical dimension CD3 subtracts the critical dimension CD4 may be from −0.3 nm to 0.2 nm. Similarly, the ridge portions 32N may have a substantially uniformed width without an obvious variation along the vertical direction VD. The values of the dimensions and the roughness are exemplary depicted for presenting the smooth sidewalls and the uniformity of the profiles, but the disclosure is not limited thereto.

In some embodiments, each of the bottom portions 34P may have a taper sidewall S34P which is included with the cross-fin direction TD by an angle θ34P. Similarly, each of the bottom portions 34N may have a taper sidewall S34N which is included with the cross-fin direction TD by an angle θ34. In some embodiments, the angle θ34N and the angle θ34P may be greater than 100°, for example, from 107° to 110°, but the disclosure is not limited thereto. In some embodiments, the sidewalls S32P and the sidewalls S32N may be included to the cross-fin direction TD by about 90°, for example, 90°±2°~90°±5° and more vertical than the taper sidewalls S34P and the taper sidewalls S34N. The bottom portions 34P and the bottom portions 34N are gradually wider toward the substrate 10 to provide large base structures for supporting the ridge portions 32P and the ridge portions 32N.

The profile of the fin structures 30P and the fin structures 30N may have better linearity along the lengthwise directions LD. In some embodiments, a space distance SD between adjacent two of the fin structures 30P and the fin structures 30N may be substantially uniformed without an obvious variation along the lengthwise directions LD. For example, a line edge roughness (LER) may be refer to a deviation of a feature edge from an ideal shape. In some embodiments, the LER of one or more of the fin structures 30P and the fin structures 30N with a critical dimension of about 8 nm may be less than 3 nm, for example, 2.2 nm as an example. Accordingly, the fin structures 30P and the fin strictures 30P may involve less wiggle to achieve a desirable linearity and uniformity of the profile extending along the lengthwise directions LD.

Figure 5:
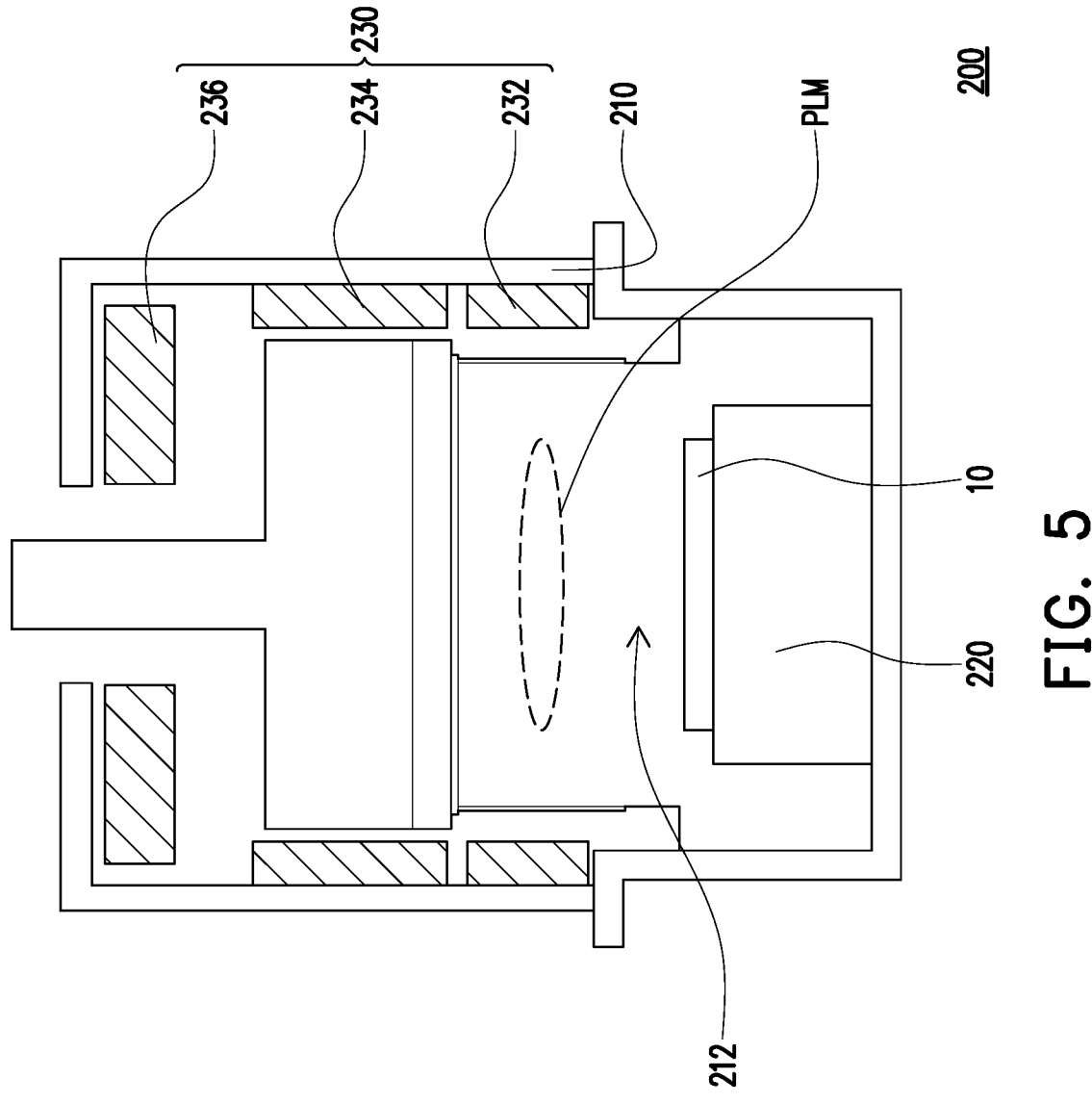
FIG. 5 schematically illustrates an apparatus for fabricating a semiconductor device according to an embodiment of the disclosure.

In some embodiments, the fin structures 30N and the fin structures 30P may be fabricated on the substrate 10 by a fin process including the main etching stage and the bottom etching stage. In some embodiments, the main etching stage and the bottom etching stage may involve a dry etching technique and may be performed in an etching apparatus 200 as shown in FIG. 5. The etching apparatus 200 includes a housing 210 accommodating a chamber space 212, a stage 220 placed within the chamber space 212 for carrying and supporting the substrate indicated in FIGS. 2 to 4, and a plurality of coil sets 230 arranged over and around the chamber space 212. The coil sets 230 may include a first coil set 232, a second coil set 234, and a third coil set 236 respectively located at different levels, but the disclosure is not limited thereto. In some embodiments, the etching apparatus 200 may provide an electron cyclotron resonance (ECR) plasma PLM within the chamber space 212, but the disclosure is not limited thereto. In some embodiments, an RF power may be applied to the coil sets 230 disposed over or around the chamber space 212 to control the ECR plasma PLM within the chamber space 212. In some embodiments, the substrate 10 with the mask patterns 24 thereon which is shown in FIG. 2 is placed on the stage 220 in the chamber space 212 of the etching apparatus 200 and the fin process may be performed on the substrate 10 with the mask patterns 24 thereon within the chamber space 212 to form the fin structures 30P and the fin structures 30N shown in FIG. 4.

In some embodiments, source gases for the fin process introduced into the chamber space 212 may include one or more selected from the group consisting of HBr, $O_2$, $SF_6$, $Cl_2$, $CHF_3$, $CO_2$, $SO_2$, $C_4F_8$, $C_4F_6$, $CF_4$, $NF_3$, Ar, $H_2$, $N_2$ and He. In some embodiments, $O_2$, $CO_2$, $SO_2$, Nz, $C_4F_8$, $C_4F_6$ or the like may be served as passivating gas; $Cl_2$, $SF_6$, $NF_3$, $CHF_3$, $CF_4$, or the like may be served as etchant gas; and Ar, Hz, He or the like may be served as carrier gas. In some embodiments, the main etching stage may include several process cycles and, similarly, the bottom etching stage may include several process cycles. Each of the process cycles may include at least one of a chlorine-based etching operation using the chlorine-based gas as the etching gas, a fluorine-based etching operation using the fluorine based gas as the etching gas, and a passivating operation using the passivating gas as the reactive gas, but the disclosure is not limited thereto.

Figure 6:
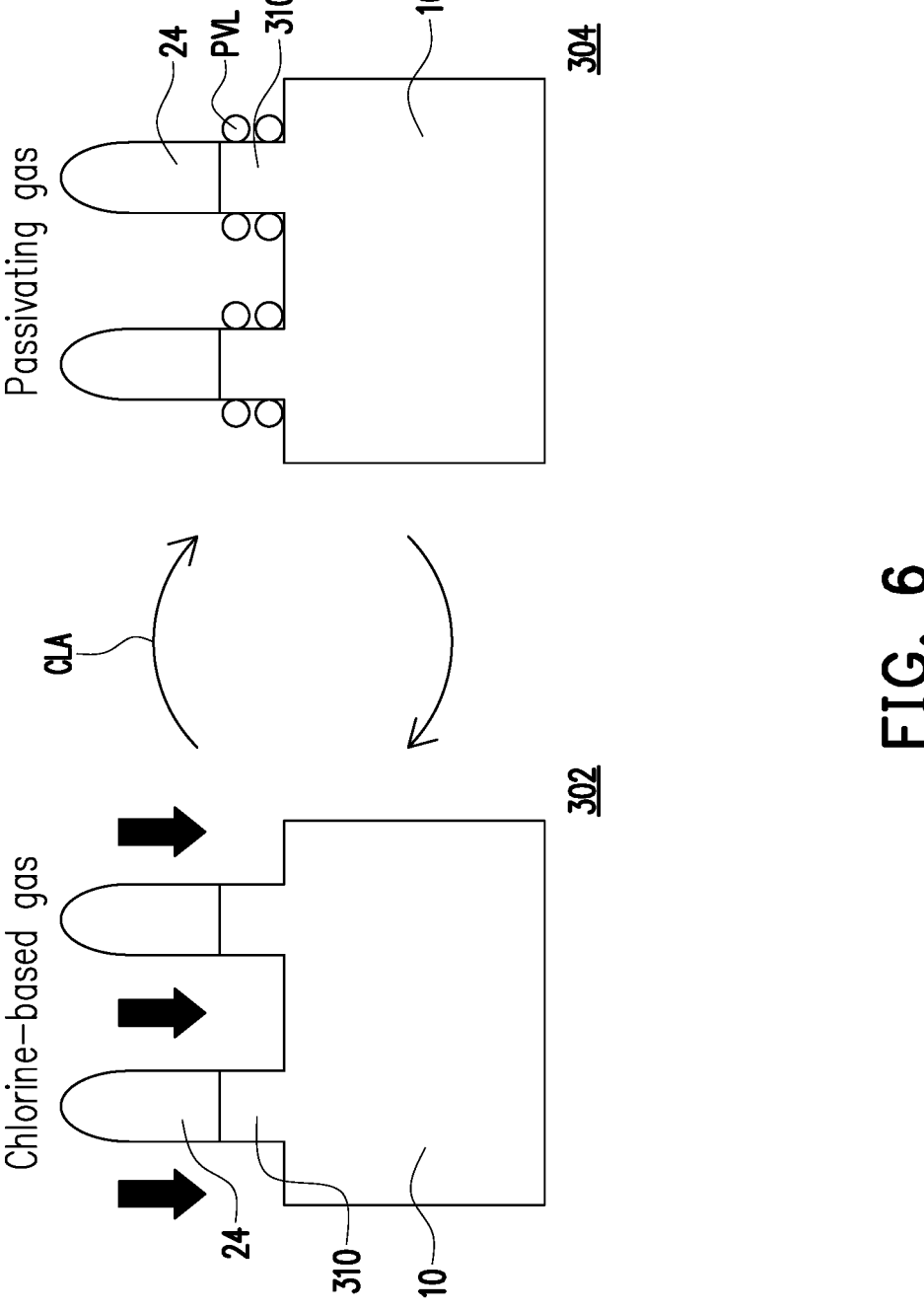
FIG. 6 schematically illustrates a process cycle in a fin process in accordance with some embodiments.

FIG. 6 schematically illustrates a process cycle in a fin process in accordance with some embodiments. FIG. 6 shows a first process cycle CLA including performing a chlorine-based etching operation 302 and a passivating operation 304 in sequence. The chlorine-based etching operation 302 may indicate the etching operation that the etchant gas such as $Cl_2$ carried by the carrier gas such as Ar is introduced in the chamber space 212 shown in FIG. 5. In some embodiments, the chlorine-based etching operation 302 may be fluorine free. The passivating operation 304 following the chlorine-base etching operation 302 may indicate the operation that the passivating gas such as $O_2$, $CO_2$, and/or $SO_2$ carried by the carrier gas such as Ar is introduced in the chamber space 212 shown in FIG. 5.

In some embodiments, the main etching stage for forming the ridge portions 32P and 32N shown in FIG. 3 may include performing the first process cycle CLA a number of times. In some embodiments, the main etching stage for forming the ridge portions 32P and 32N shown in FIG. 3 includes performing the first process cycle CLA twice to form an etched feature 310 for forming the ridge portions 32P or 32N shown in FIG. 3. During the first time of the first process cycle CLA, $Cl_2$ is introduced into the chamber space 212 as the etching gas, Ar is used as the carrier gas, and the chlorine-based etching operation 302 is performed until a predetermined etching depth is reached to form the etched feature 310. Subsequently, the passivating operation 304 may be performed by introducing $CO_2$ as the passivating gas into the chamber space 212. In some embodiments, during the first time of the first process cycle CLA, the passivating operation 304 may be further performed by introducing another passivating gas such as $N_2$ into the chamber space 212 after the $CO_2$ passivating. In other words, the passivating operation 304 may involve a double passivating using two passivating gases, $CO_2$ and $N_2$, alternately during the first time of the first process cycle CLA in the main etching stage. Due to the passivating operation 304, a passivating layer PVL may be formed on the outer surface of the etched feature 310 to serve as a protection liner. In some embodiments, the double passivating of the passivating operation 304 helps to improve the protection of the etched feature 310 which is more helpful for ensuring the profile of an N-type feature such as the ridge portions 32N shown in FIG. 3.

During the second time of the first process cycle CLA, the chlorine-based etching operation 302 is performed by introducing $Cl_2$ and Ar into the chamber space 212 until a predetermined etching depth to form the etched feature 310, and subsequently, the passivating operation 304 may be performed by introducing $CO_2$ as the passivating gas into the chamber space 212 to form the passivating layer PVL on the outer surface of the etched feature 310. The passivating operation 304 performed during the second time of the first process cycle CLA may not adopt the double passivating but only be performed by introducing $CO_2$ as the passivating gas into the chamber space 212 without the further passivating using another passivating gas.

Figure 7:
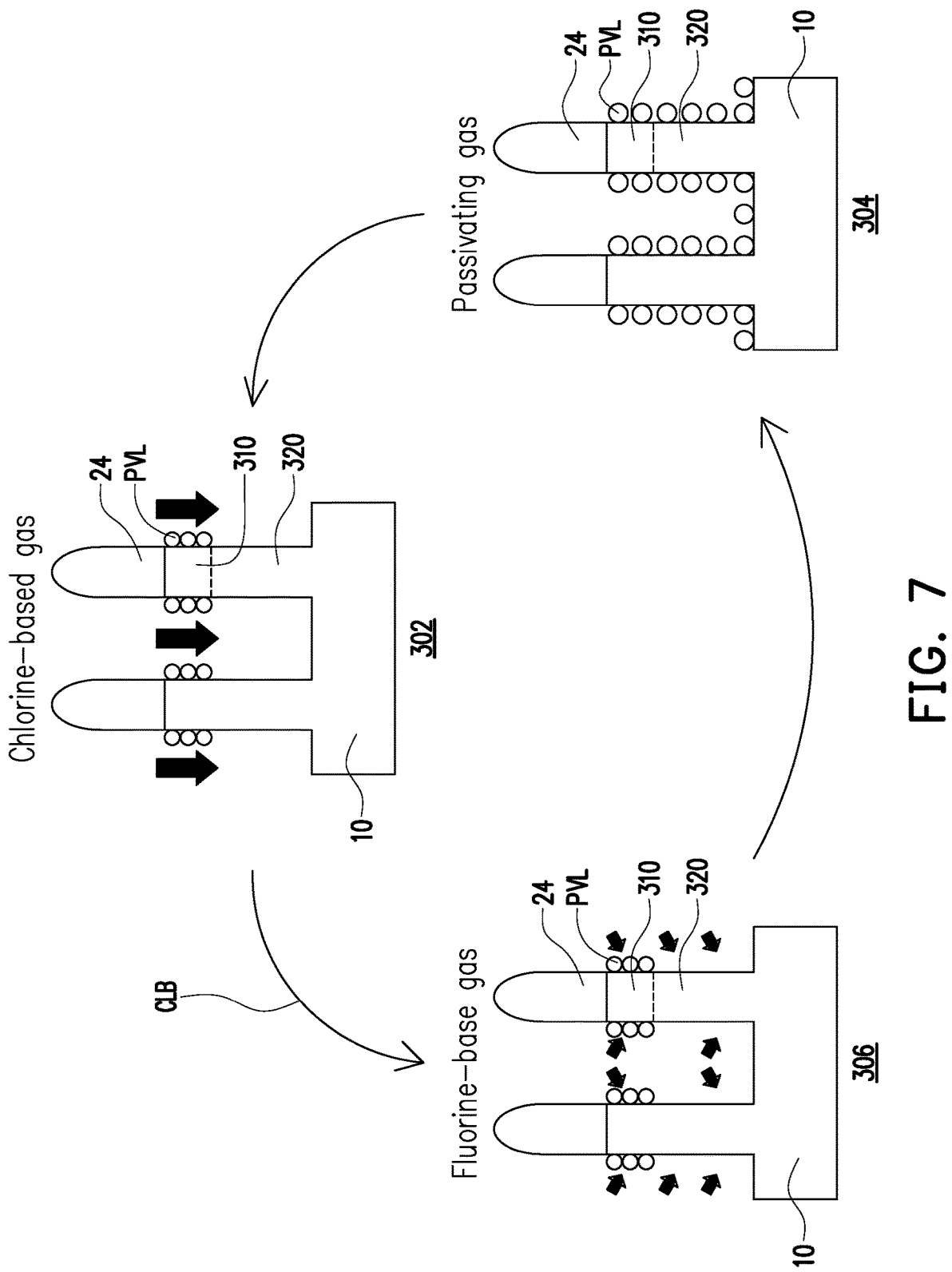
FIG. 7 schematically illustrates a process cycle in a fin process in accordance with some embodiments.

After performing the first process cycle CLA twice, the main etching stage is proceeded by performing a second process cycle CLB as shown in FIG. 7 a number of times. In some embodiments, the second process cycle CLB includes the chlorine-based etching operation 302, a fluorine-based etching operation 306, and the passivating operation 304 sequentially performed. In some embodiments, the second process cycle CLB is performed three times after the first process cycle CLA has been performed twice, and the three second process cycles CL2 may be performed by repeating the same operations flow without modifying the respective operations, but the disclosure is not limited thereto.

During the second process cycle CLB, the chlorine-based etching operation 302 may be performed by introducing $Cl_2$ and Ar into the chamber space 212 and proceeded until a predetermined etching depth is reached, then the fluorine-based etching operation 306 is performed by introducing $CHF_3$ and/or $SF_6$ with the carrier gas such as Ar into the chamber space 212, and the passivating operation 304 may be performed by introducing $CO_2/SO_2$ as the passivating gas into the chamber space 212. In some embodiments, the passivating operation 304 performed at the last time of the second process cycle CLB may adopt only $CO_2$ as the passivating gas, but the disclosure is not limited thereto. In some embodiments, the chlorine-based etching operation 302 may provide an anisotropic etching effect to reduce the thickness of the substrate 10 to form the etched feature 320 and the fluorine-based etching operation 306 may provide an etching effect that involves lateral etching effect. In addition, the etched feature 310 formed by twice of the first process cycle CLA is covered by the passivating layer PVL and thus, the fluorine-based etching operation 306 though provide the laterally etching effect would least damage the profile of the etched feature 310 to maintain the structural feature of the previously formed structure.

In some embodiments, the first time of the first process cycle CLA may be performed until reaching an etching depth of 15-20 nm, the second time of the first process cycle CLA may be performed until reaching an etching depth of 15 nm, and each time of the second process cycle CLB may be performed until reaching an etching depth of 15 nm, but the disclosure is not limited thereto. In some embodiments, the times of the first process cycle CLA and the second process cycle CLB may be determined based on the required dimension of the ridge portions 32P and the ridge portions 32N shown in FIG. 3. In some embodiments, the main etching stage including performing the first process cycle CLA twice followed by performing the second process cycle CLB three times may obtain the ridge portions 32P of 75 nm in height and the ridge portions 32N of 90 nm in height shown in FIG. 3 since the etching operations may reach different etching depths on the material of the epitaxial layer 12 and the material of the substrate 10. However, the disclosure is not limited thereto.

In some embodiments, the second mask pattern 24B of the mask patterns 24 shown in FIG. 2 may be gradually reduced during the etching operations of FIGS. 6 and 7 and thus the second mask pattern 24B may be completely removed during the main etching process. In addition, after the main etching stage, the bottom etching stage is performed using the same etching apparatus 200. In some embodiments, the bottom etching stage for forming the bottom portions 34P and 34N shown in FIG. 4 may include performing a third process cycle CLC as shown in FIG. 8 a number of times.

Figure 8:
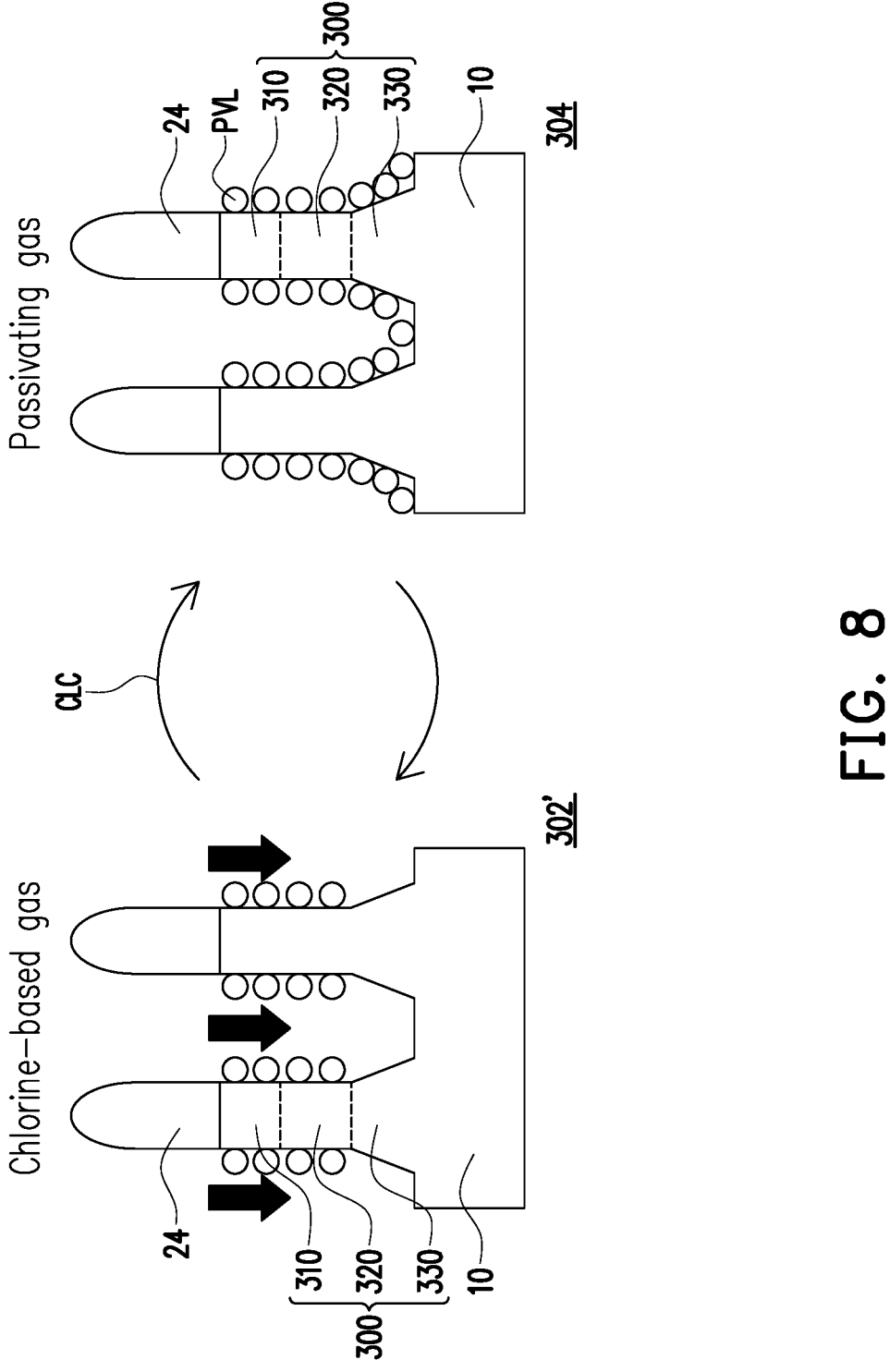
FIG. 8 schematically illustrates a process cycle in a fin process in accordance with some embodiments.

As shown in FIG. 8, the bottom etching stage is performed on the substrate 10 with the etched feature 310 and the etched feature 320 formed thereon to form an etched feature 330. The etched feature 320 is positioned between the etched feature 310 and the etched feature 330 to form a fin structure 330. The etched feature 330 may have a taper shape and the sidewall of the etched feature 330 may be oblique with respect to the sidewalls of the etched feature 310 and the etched feature 320. In some embodiments, the etched feature 310 may be more vertical than the etched feature 330 and the etched feature 320 may be more vertical than the etched feature 330. In addition, the surface of the fin structure 330 may be covered by the passivating layer PVL.

In some embodiments, the third process cycle CLC may include a modified chlorine-based etching operation 302' performed by introducing the etchant gases $Cl_2$ and $NF_3$ with the carrier gas Ar into the chamber space 212 and the passivating operation 304 performed by introducing $O_2$ as the passivating gas into the chamber space 212. In some embodiments, the bottom etching stage may include performing the third process cycle CLC six times, but the disclosure is not limited thereto. During each time of the third process cycle CLC, the etchant gases $Cl_2$ and $NF_3$ are used in the modified chlorine-based etching operation 302', while the etchant gas $Cl_2$ provides the anisotropic etching effect to reduce the thickness of the substrate 10 and the etchant gas $NF_3$ provides a further cleaning effect to clean the byproducts produced during the etching operations. During each time of the third process cycle CLC, the etched feature 310 and the etched feature 320 are protected by the previously formed passivating layer PVL so that the profiles and the structures of the etched feature 310 and the etched feature 320 may remain unchanged during the bottom etching stage.

After the bottom etching stage, the fin structure 300 is formed and the fin structure 30 may serve as an implemental example of the fin structures 30N and the fin structures 30P. During the bottom etching stage, the etchant gas $Cl_2$ provides the anisotropic etching effect so that the lateral etching effect may be minor to form the taper sidewalls S34P and S34N of the bottom portions 34P and 34N as shown in FIG. 4. In addition, the bottom portions 34P and 34N serve as large base structures supporting the ridge portions 32P and 32N so that the profiles of the ridge portions 32P and the ridge portions 32N may properly extend in a straight path without undesirable wiggle. As such, the pitch between adjacent two of the fin structures 30P and 30N may be substantially maintained without an obviously variation.

In some embodiments, the etching depths of each etching operation may be determined based on various design, and the values and numbers disclosed in the disclosure are only examples without the intention to limit the disclosure. In some embodiments, before the main etching stage, a further top etching process may be performed and the further top etching process may include the chlorine-based etching operation 302 performed by introducing the etchant gas $Cl_2$ with the carrier gas Ar into the chamber space 212 and the passivating operation 304 performed by introducing $O_2/SO_2$ as the passivating gas into the chamber space 212. During the further top etching process performed before the main etching stage, $SO_2$ may be used as the passivating gas, which helps to enhance the protection of the etched feature.

In some embodiments, during the chlorine-based etching operation 302 adopted in the first process cycle CLA, in the second process cycle CLB and the further top etching process described above, the current on the coil sets 230 of the etching apparatus 200 shown in FIG. 5 may be set at a high level, such as 11A to 21A, etc. that is higher than 7A, which facilitates to adjust the plasma distribution inside the chamber space 212. In some embodiments, the chlorine-based etching operation 302 may be performed under higher current on the coil set 230 than the fluorine-based etching operation 306. In some embodiments, the chlorine-based etching operation 302 with high current on the coil set 230 helps to reach uniformed etching depths at the region adjacent to the edge of the substrate 10 and at the region adjacent to the center of the substrate 10. In addition, the power used during the chlorine-based etching operation 302 may be high, such as in a range from about 900 W to about 1400 W, which helps the chlorine-based etching operation 302 to reach the predetermined etching depth.

Figure 9B:
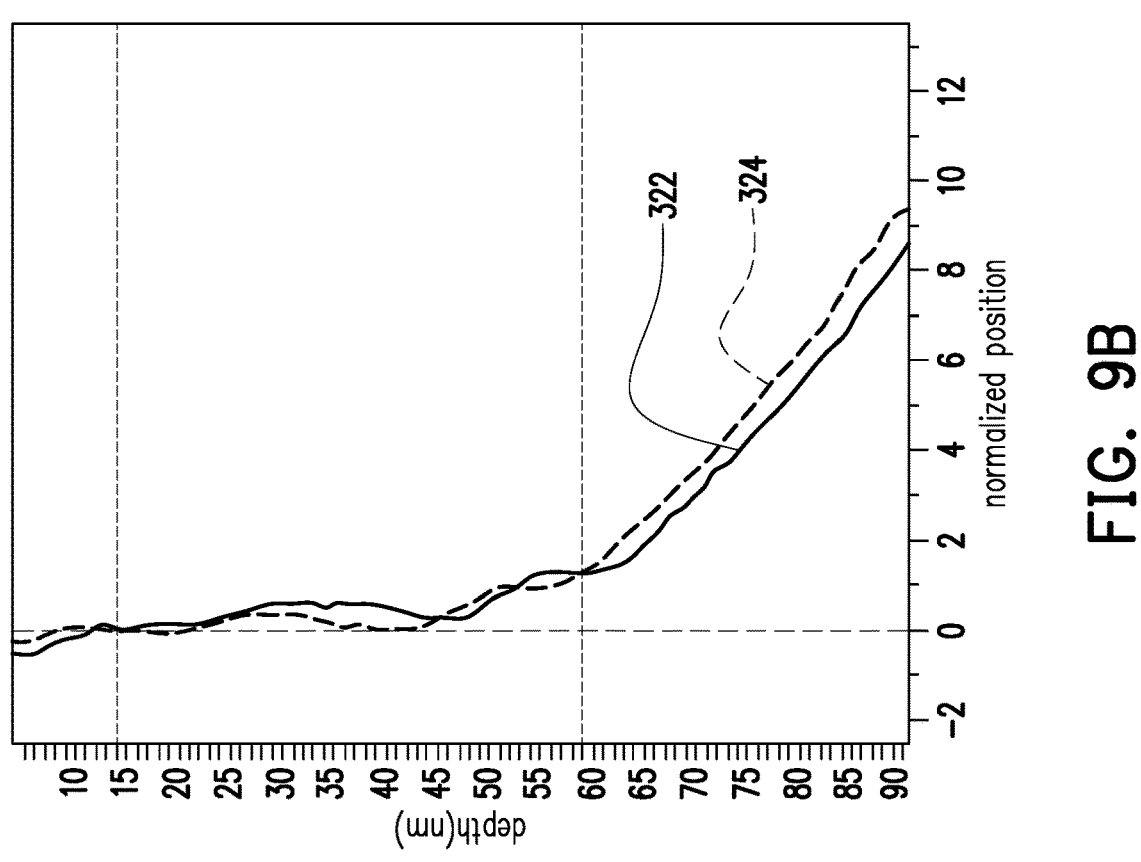
FIGS. 9A and 9B schematically illustrates profile lines of fin structures fabricated using the process of some embodiments of the disclosure.
Figure 9A:
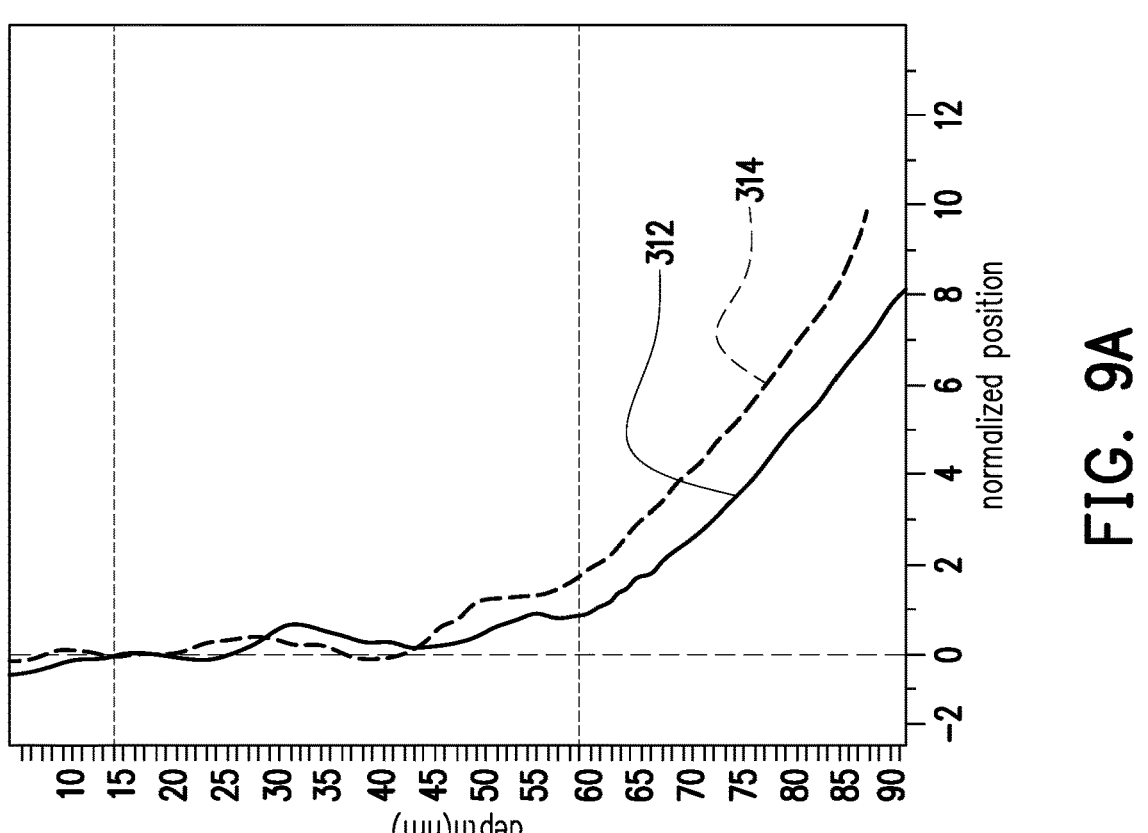

In some embodiments, as shown in FIG. 9A, the profile line 312 and the profile line 314 represent the physical side edges of two fin structures fabricated using the process described in FIGS. 6 to 8 while during the chlorine-based etching operation 302 adopted in the first process cycle CLA, in the second process cycle CLB and before the further top etching process described above, the current of the coil sets 230 in the etching apparatus 200 of FIG. 5 may be set at 11A. The profile line 312 may represent a fabricated fin structure located adjacent to the substrate center and the profile 314 may represent a fabricated fin structure located adjacent to the substrate edge. In FIG. 9B, the profile line 322 and the profile line 324 represent the physical side edges of two fin structures fabricated using the process described in FIGS. 6 to 8 while during the chlorine-based etching operation 302 adopted in the first process cycle CLA, in the second process cycle CLB and before the further top etching process described above, the current of the coil sets 230 in the etching apparatus 200 of FIG. 5 may be set at 21A. The profile line 322 may represent may be a fabricated fin structure located adjacent to the substrate center and the profile 324 may represent may be a fabricated fin structure located adjacent to the substrate edge. As shown in FIG. 9A and FIG. 9B, the consistency of the profile line 322 and the profile line 324 may be greater than the consistency of the profile line 312 and the profile line 314. Therefore, the chlorine-based etching operation performed under a large coil current such as 21A may provide etching effect with better uniformity on different regions of the substrate. For example, the etching operation may reach similar etching depths at the substrate center and the substrate edge, which may improve the uniformity of the profiles of the etched features at different regions.

Figure 10:
FIGS. 10 to 14 schematically illustrate several steps of fabricating a semiconductor device in accordance with some embodiments.

FIGS. 10 to 14 schematically illustrate several steps of fabricating a semiconductor device in accordance with some embodiments. In FIG. 10, the step performed after the structure of FIG. 4 is obtained includes forming an insulation structure 40 and a dielectric structure 50. The insulation structure 40 and the dielectric structure 50 may include a material selected from silicon oxide, silicon nitride, silicon oxynitride (SiON), SiOCN, SiCN, fluorine-doped silicate glass (FSG), or a low-k dielectric material, and may be formed by Atomic Layer Deposition (ALD), High-Density Plasma Chemical Vapor Deposition (HDPCVD), or Chemical Vapor Deposition (CVD). In some embodiments, the insulation structure 40 and the dielectric structure 50 are made of different materials. For example, the insulation structure 40 is made of silicon oxide and the dielectric structure 50 is made of silicon carbon nitride, but the disclosure is not limited thereto.

The insulation structure 40 may include multiple sub-layers 40A~40D sequentially formed on the substrate 10. An anneal operation may be performed after the formation of the insulation structure 40 and/or the dielectric structure 50. Each of the sub-layers 40A~40D of the insulation structure 40 may substantially conform to the surfaces of the fin structures 30P and 30N. In some embodiments, the dielectric structure 50 may include a liner layer 50A formed on the insulation structure 40 and a fill material 50B formed on the liner layer 50A. The liner layer 50A may include the material the same as the fill material 50B, but the disclosure is not limited thereto. In some embodiments, the fill material 50B may be formed by using Flowable Chemical Vapor Deposition (FCVD), spin-on coating, or the like. In addition, a planarization process such as a Chemical Mechanical Polish (CMP) process or a mechanical grinding process may be further performed to obtain a structure with flat top surface as shown in FIG. 10, but the disclosure is not limited thereto.

Figure 11:
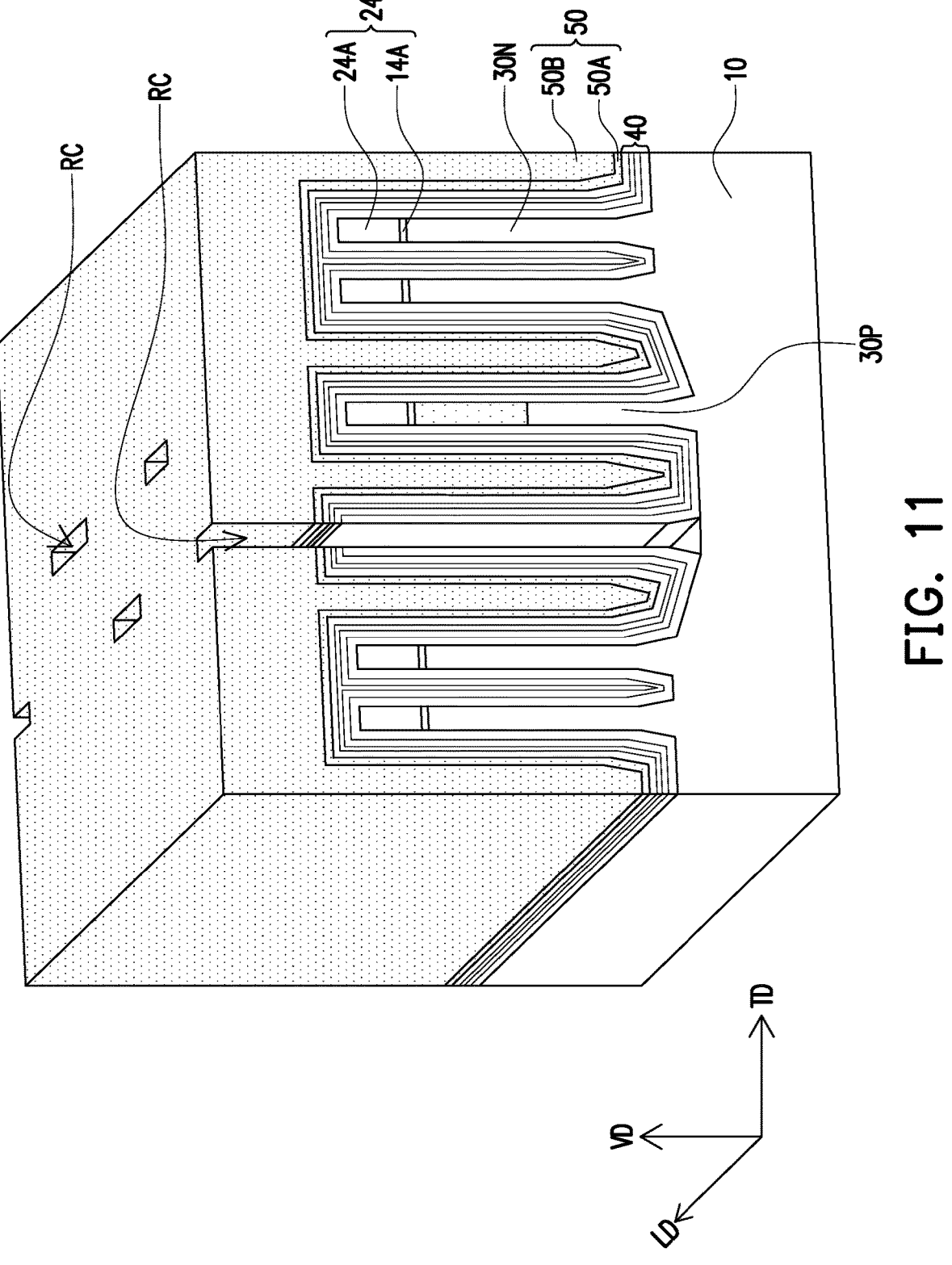

In FIG. 11, a patterning step is performed to remove a portion of the dielectric structure 50, the corresponding portions of the insulation structure 40 under the removed portion of the dielectric structure 50 and the corresponding portions of the fin structures 30N under the removed portion of the insulation structure 40 so that a plurality of recesses RC is formed. In some embodiments, the recess RC may be arranged along the fin structures 30P and thus, one or more fin structures 30P is cut to be discontinuous. The patterning step of FIG. 11 may adopt an anisotropic etching technique. The patterning step of FIG. 11 may be performed when a mask pattern (not shown) is formed on the dielectric structure 50. The patterning step of FIG. 11 may optionally remove a portion of the fin structures 30P while the fin structures 30N may not be patterned, but the disclosure is not limited thereto.

Figure 12:
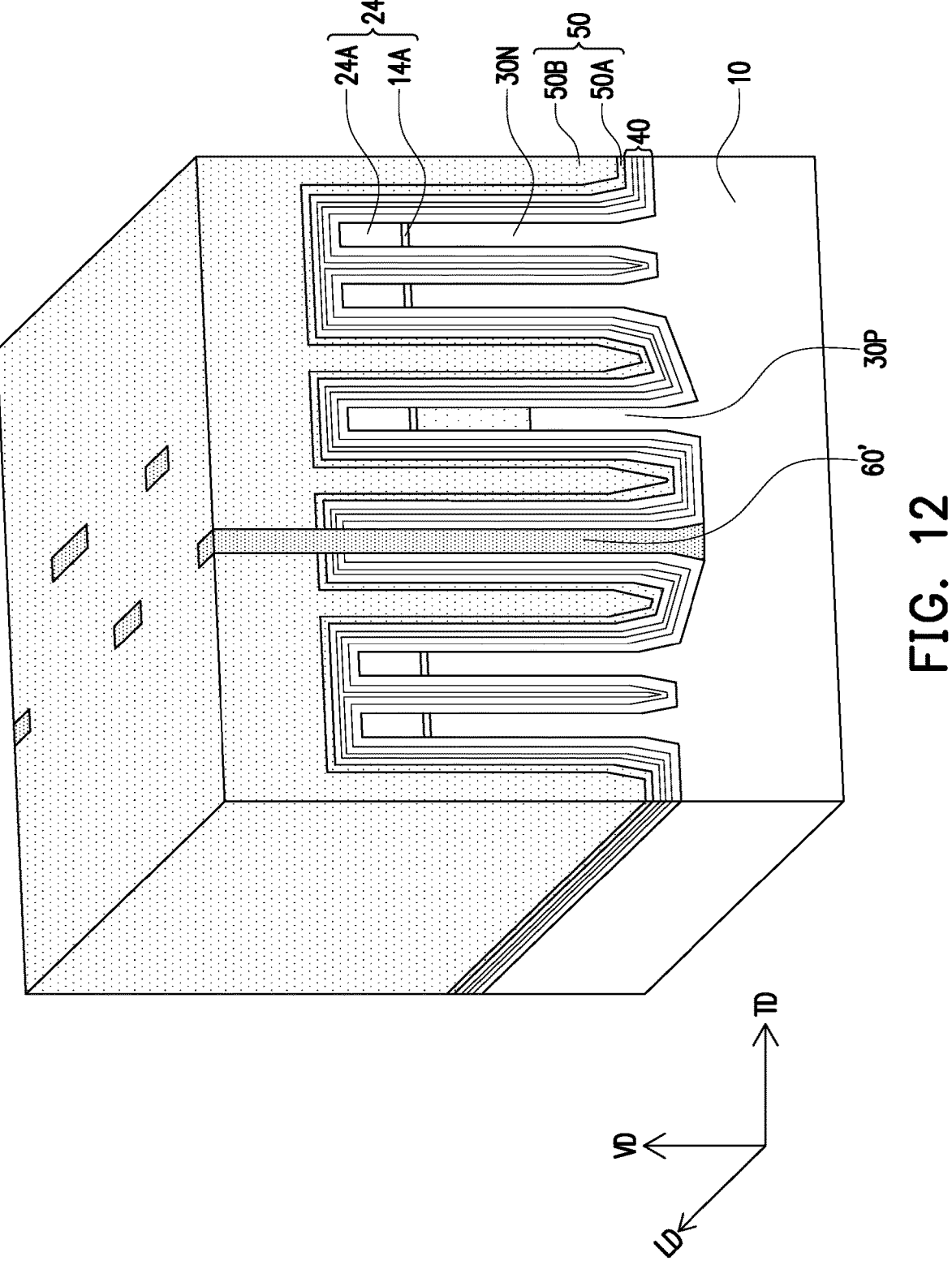
Figure 13:
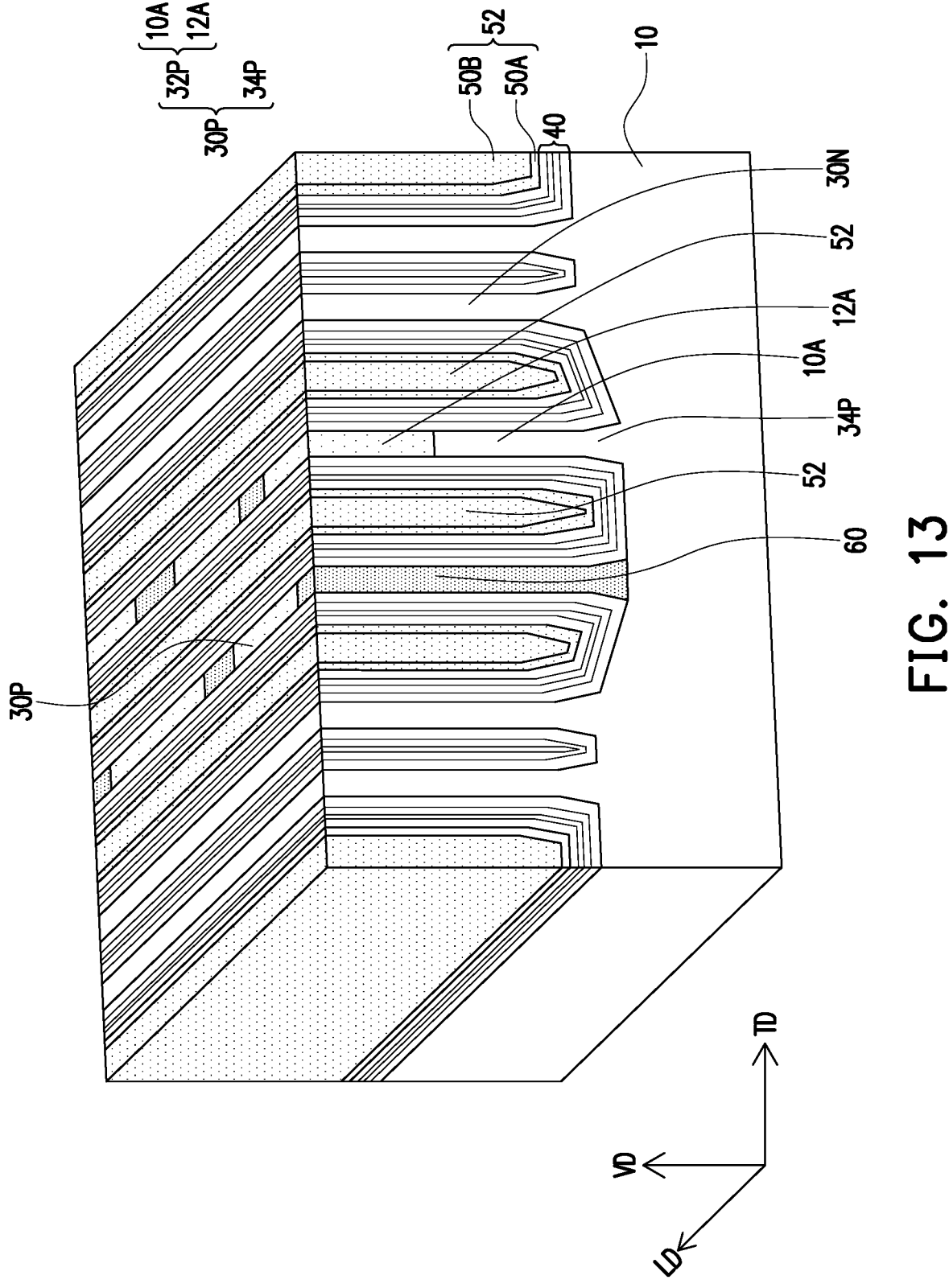

In FIG. 12, the recesses RC are filled with a dielectric material 60'. The dielectric material 60' may include a nitride material such as silicon nitride, but the disclosure is not limited thereto. The dielectric material 60' may fill the recess RC. Subsequently, in FIG. 13, a planarization process is performed to remove the materials over the fin structures 30P and 30N. Accordingly, the isolation structures 60 and dielectric fin structures 52 are formed. The planarization process is performed until the fin structures 30P and 30N are exposed. The isolation structures 60 may be formed to replace the removed portions of the fin structures 30P. The dielectric structure 50 in FIG. 12 is patterned into the dielectric fin structures 52 between two of the fin structures 30P and 30N. The tops of the isolation structures 60, the fin structures 30P, the fin structures 30N, the insulation structure 40 and the dielectric fin structures 52 are exposed and coplanar. In addition, the insulation structure 40 is disposed between adjacent two of the isolation structures 60, the fin structures 30P, the fin structures 30N and the dielectric fin structures 52.

Figure 14:
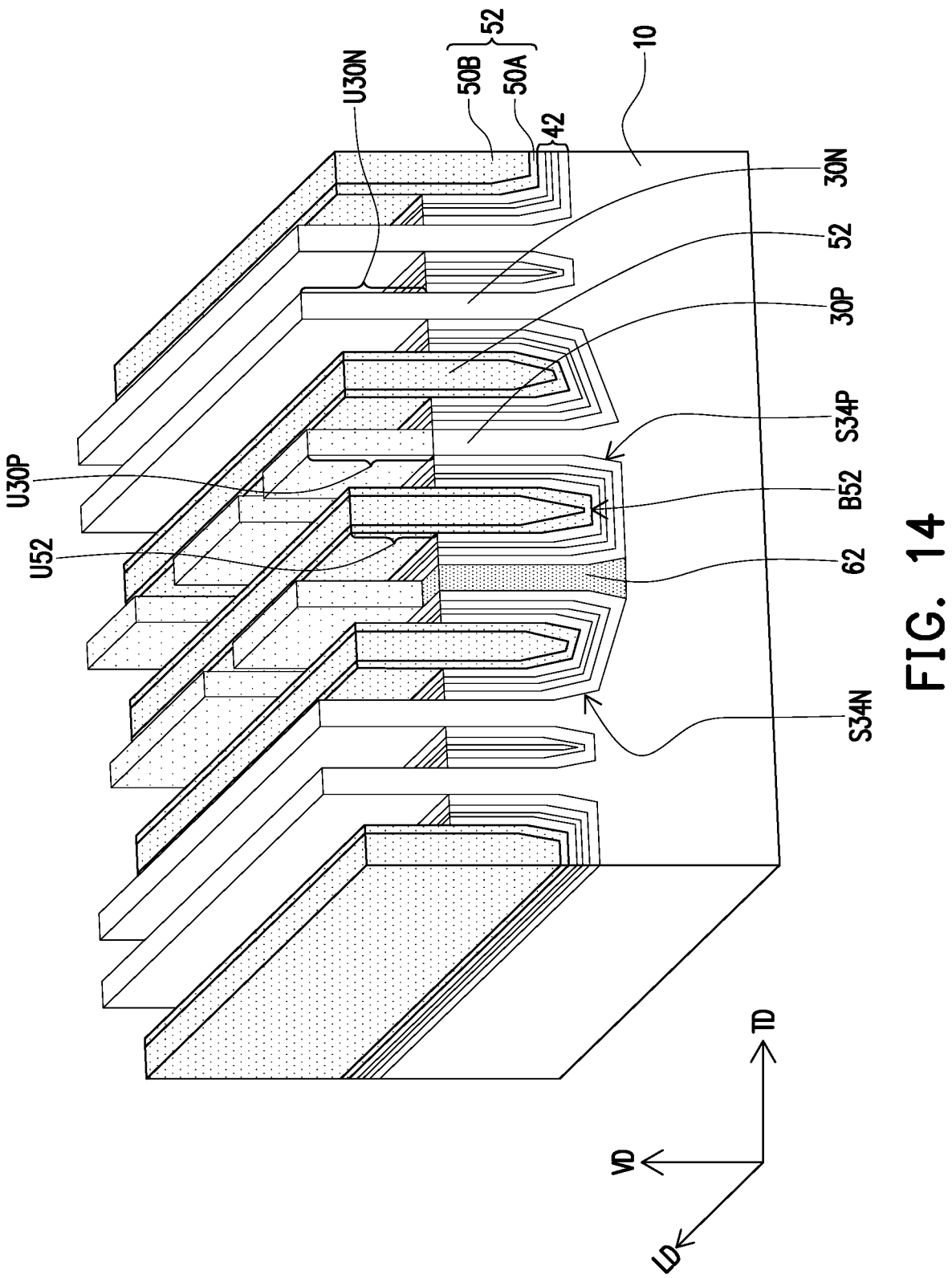

In FIG. 14, a patterning step is performed to remove a portion of the insulation structure 40 to form a shallow trench isolation 42 and simultaneously remove a portion of the isolation structure 60 to form the isolation patterns 62. The shallow trench isolation 42 is disposed between adjacent two of the dielectric fin structures 52 and the fin structures 30P and 30N. The patterning step of FIG. 14 may be performed using a dry etching process, wherein $HF_3$ and $NH_3$, for example, are used as the etching gases. In some alternative embodiments, the patterning step of FIG. 14 is performed using a wet etch process and the etching chemical may include HF, for example. In some embodiments, the tops of the shallow trench isolation 42 and the isolation patterns 62 may be coplanar.

The patterning step for forming the shallow trench isolation 42 may not remove the fin structures 30P and 30N and the dielectric fin structures 52. Therefore, the fin structures 30P and 30N and the dielectric structures 52 are protruded in the vertical direction VD from the shallow trench isolation 42. For example, the upper portion U30P of the fin structures 30P, the upper portion U30N of the fin structures 30N and the upper portion U52 of the dielectric fin structures 52 are exposed above the shallow trench isolation 42. In some embodiments, the fin structures 30P are cut at the step of FIG. 11 and thus, one or more of the fin structures 30P may be discontinuously extending along a linear direction. In addition, in the cross-fin direction TD, the fin structures 30P, the fin structures 30N and the dielectric fin structures 52 may be arranged nest to one another. In some embodiments, the dielectric fin structures 52 may be omitted between adjacent two of the fin structures 30P and the fin structures 30N.

In some embodiments, the dielectric fin structures 52 may have a taper bottom B52 corresponding to the taper sidewalls S34P and the taper sidewalls S34N of the fin structures 30P and 30N. One or more of the dielectric fin structures 52 may have a critical dimension gradually reduced toward the substrate 10. The shallow isolation trench 42 may form a plurality of U-shape structures and dielectric fin structures 52 may be inserted in the central recesses of the U-shape structures. In some embodiments, the sub-layers of the shallow trench isolation 42 may be formed along the taper sidewalls S34P and the taper sidewalls S34N, which may improve the sidewall coverage of the sub-layers of the shallow trench isolation 42.

After the shallow trench isolation 70 is formed, one or more wet cleaning operations may be performed in some embodiments. In some embodiments, a thin oxide layer may be further formed on the exposed surfaces of the fin structures 30P and 30N. In some embodiments, a trimming process may be optionally performed to further reduce the dimension of the fin structures 30P and 30N. In some embodiments, adjacent two of the fin structures 30P and 30N may not be interposed by the dielectric fin structures 52 since the distance between the two of the fin structures 30P and 30N is small. In some embodiments, the processes of forming a gate electrode, forming source and drain regions, forming contact structures are performed after the step of FIG. 14 to obtain a semiconductor device such as a Fin-FET. In some embodiments, the process of forming the fin structures 30P and 30N into nano structures such as nano sheets, nano rods, or the like may be further performed to obtain a semiconductor device having GAA (gate all around) structure.

FIGS. 15 to 19 schematically illustrate several steps of a method of abricating a semiconductor device in accordance with some embodiments of the disclosure. In FIGS. 15 to 19, the substrate 10 with the fin structures 30 isolated from one another by the shallow trench isolation 42 is provided. In some embodiments, the fin structures 30 may be implemented by the fin structures 30P and the fin structures 30N described in the previous embodiments and the substrate 10 with the fin structures 30 may be fabricated by the respective steps and operations described in FIGS. 1 to 14. Accordingly, the descriptions related to the fin structures 30P, the fin structures 30N, the substrate 10, and the shallow trench isolation 42 in the previous embodiments may be incorporated in the embodiment of FIGS. 15 to 19. In some embodiments, the dielectric fin structures 52 in FIG. 14 may be further incorporated to the embodiments as shown in FIGS. 15 to 19.

Figure 15:
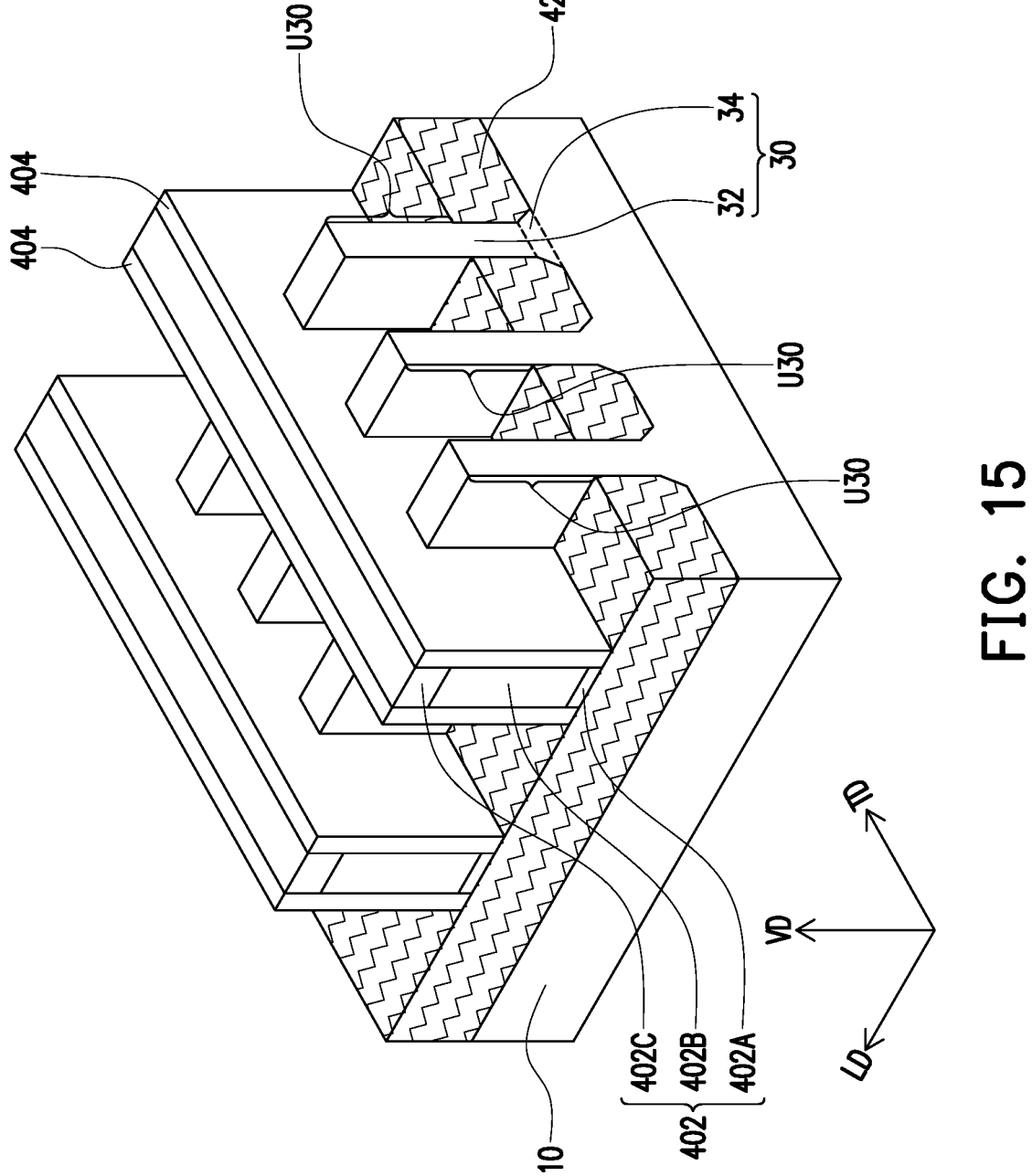
FIGS. 15 to 19 schematically illustrate several steps of a method of fabricating a semiconductor device in accordance with some embodiments of the disclosure.

In FIG. 15, one or more of the fin structures 30 may include a ridge portion 32 and a bottom portion 34 under the ridge portion 32 and the shallow trench isolation 42 may be disposed between the fine structures 30 and reveal the upper portions 30U of the fin structure 30. Dummy gate stacks 402 are formed on the shallow isolation trench 42 and each extends in the cross-fin direction TD intersecting with the lengthwise directions LD of the fin structures 30. The dummy gate stacks 402 may cover on the top surfaces and the sidewalls of the upper portions U30 of a portion of the fin structures 30. In addition, gate spacers 404 are formed on the sidewalls of dummy gate stacks 402. In some embodiments, the dummy gate stacks 402 may extend in the cross-fin direction TD across over the fin structures 30 on the shallow trench isolation 42. The dummy gate stacks 402 may have lengthwise directions (the cross-fin direction TD) perpendicular to the lengthwise directions LD of the fin structures 30. The gate spacers 404 may be formed in pair and disposed at two opposite sides of each dummy gate stack 402.

The dummy gate stacks 402 may include dummy gate dielectrics 402A and dummy gate electrodes 402B over dummy gate dielectrics 402A. The gate spacers 404 and the dummy gate dielectrics 402A may form U-shaped trenches and the dummy gate electrodes 402B is formed within the U-shaped trenches. In some embodiments, the dummy gate dielectrics 402A may be formed of silicon oxide, and the dummy gate electrodes 402B may be formed, for example, using polysilicon, and other materials may also be used. In addition, each of the dummy gate stacks 402 may also include one (or a plurality of) hard mask layer 402C over dummy gate electrodes 402B. The mask layer 402C may be formed of silicon nitride, silicon oxide, silicon carbo-nitride, or multi-layers thereof. In some embodiments, the gate spacers 404 are formed of a dielectric material(s) such as silicon nitride, silicon carbo-nitride, or the like, and may have a single-layer structure or a multi-layer structure including a plurality of dielectric layers.

Figure 16:
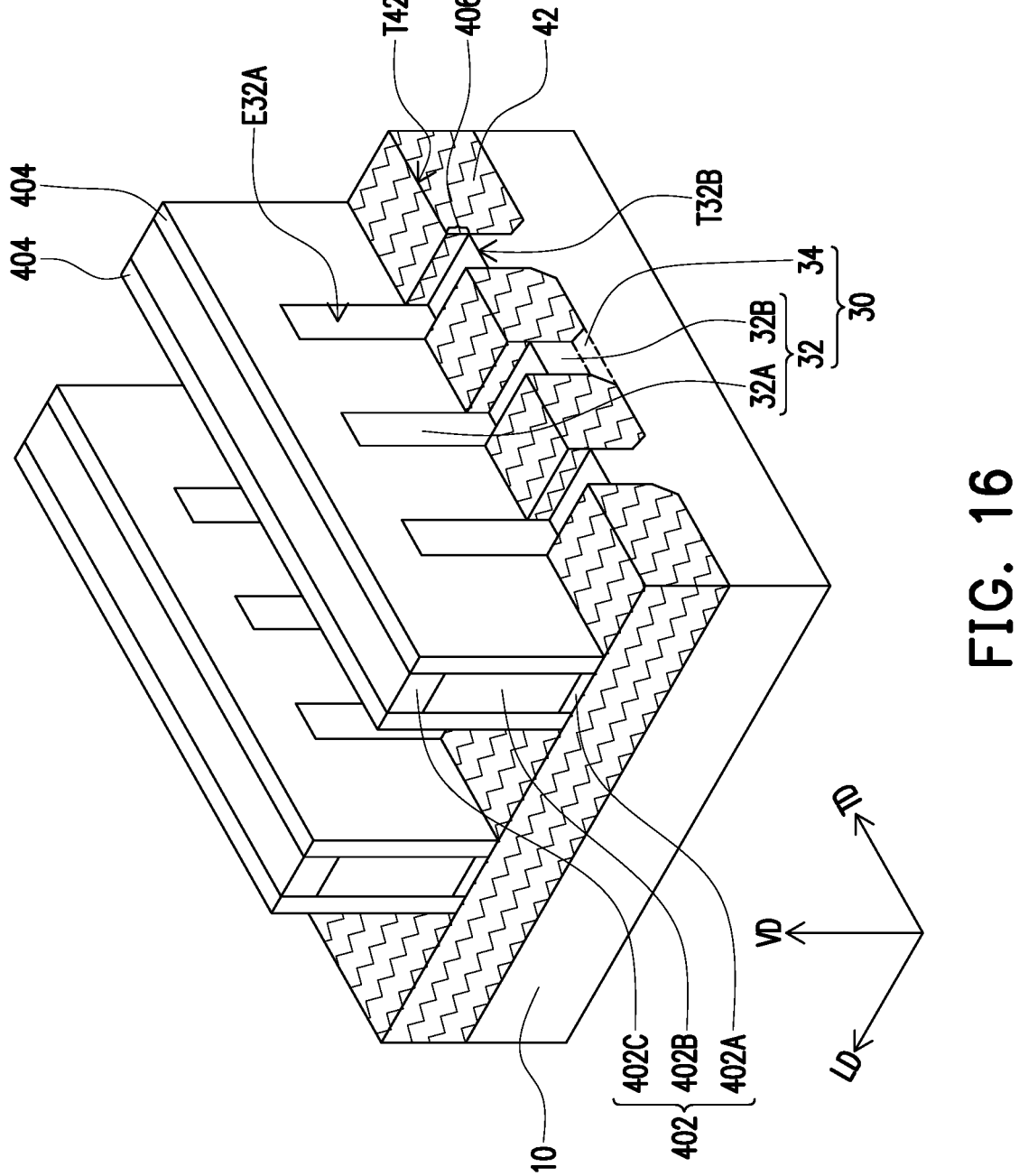

In FIG. 16, an etching step is then performed to etch exposed portions of the fin structures 30 that are not covered by the dummy gate stacks 402 and the gate spacers 404, and shielded portions of fin structures 30 directly underlying dummy gate stacks 402 and gate spacers 404 are remained without being removed. The ridge portions 32 of the fin structures 30 may be partially recessed during the step of FIG. 16 to include the channel region 32A and the fin region 32B. In some embodiments, the top surfaces T32B of the fin regions 32B of the fin structures 30 may be lower than the top surface T42 of the shallow trench isolation 42. Herein, recesses 406 are accordingly formed. In some embodiments, the step of forming the recess 406 may adopt the step of forming the ridge portions 32N and 32P described in the previous embodiment so that the exposed wall E32A may have a smooth profile similar to the sidewalls S32N and S32P described in FIG. 4, but the disclosure is not limited thereto. In some embodiments, when the fin structures 30 is served as an implemental example of the fin structure 30P described in the previous embodiment, the fin region 32A may include an epitaxial material different from the substrate 10. For example, the material of the fin region 32A may include SiGe and the material of the substrate 10 may include Si. In some embodiments, when the fin structures 30 is served as an implemental example of the fin structure 30N described in the previous embodiment, the fin region 32A is of the same material as the substrate 10.

Figure 17:
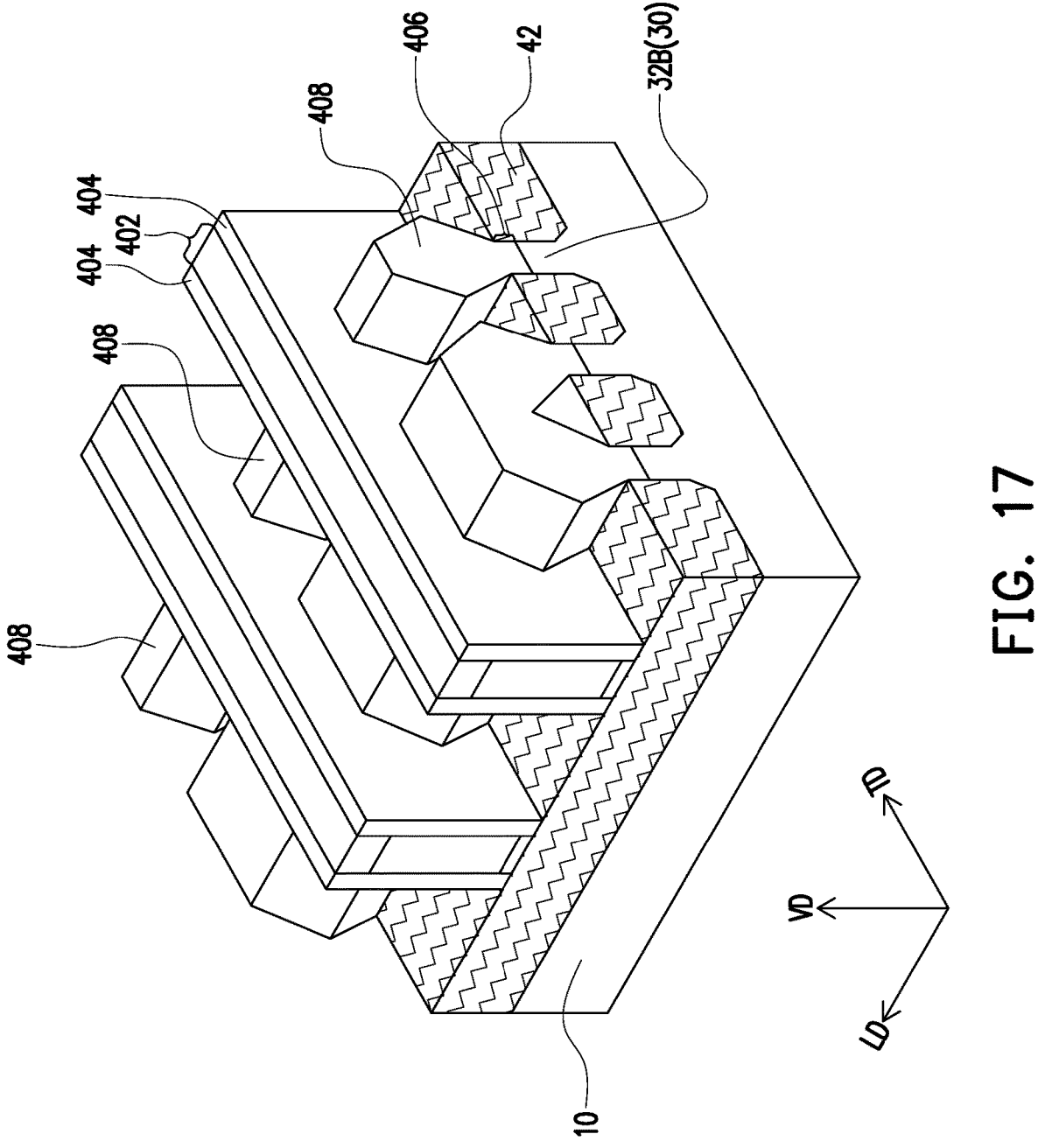

In FIG. 17, epitaxy regions (also known as source/drain regions) 408 are formed by growing (through epitaxy) appropriate semiconductor material in recesses 406. The formation of epitaxy regions 408 from different recesses 406 may be performed in separate epitaxy processes, and the details are not discussed herein. In some embodiments, for one or more device region being an n-type FinFET region, an n-type impurity is in-situ doped into the corresponding epitaxy regions 408 with the proceeding of the epitaxy, while for one or more device region being a p-type FinFET region, a p-type impurity is in-situ doped into the corresponding epitaxy regions 408 with the proceeding of the epitaxy. For example, silicon phosphorous (SiP) or silicon carbon phosphorous (SiCP) may be grown as n-type FinFET region, and silicon germanium boron (SiGeB) or silicon boron (SiB) may be grown as p-type FinFET region. In some embodiments, after the epitaxy process of forming the epitaxy regions 408, the epitaxy regions 408 may be further implanted with a p-type or an n-type impurity to form source and drain regions. In some embodiments, the implantation is skipped when the epitaxy regions 408 are in-situ doped with the n-type and p-type impurity, respectively, during the epitaxy processes. In some embodiments, further epitaxial growth of the epitaxy regions 408 causes the respective epitaxy regions 408 to expand horizontally, and facets may be formed, but the disclosure is not limited thereto. In some embodiments, the formation of the epitaxy regions 408 may be finished when the top surface of the epitaxy regions 408 is still wavy, or when the top surfaces of the merged epitaxy regions 408 have become planar.

Figure 18:
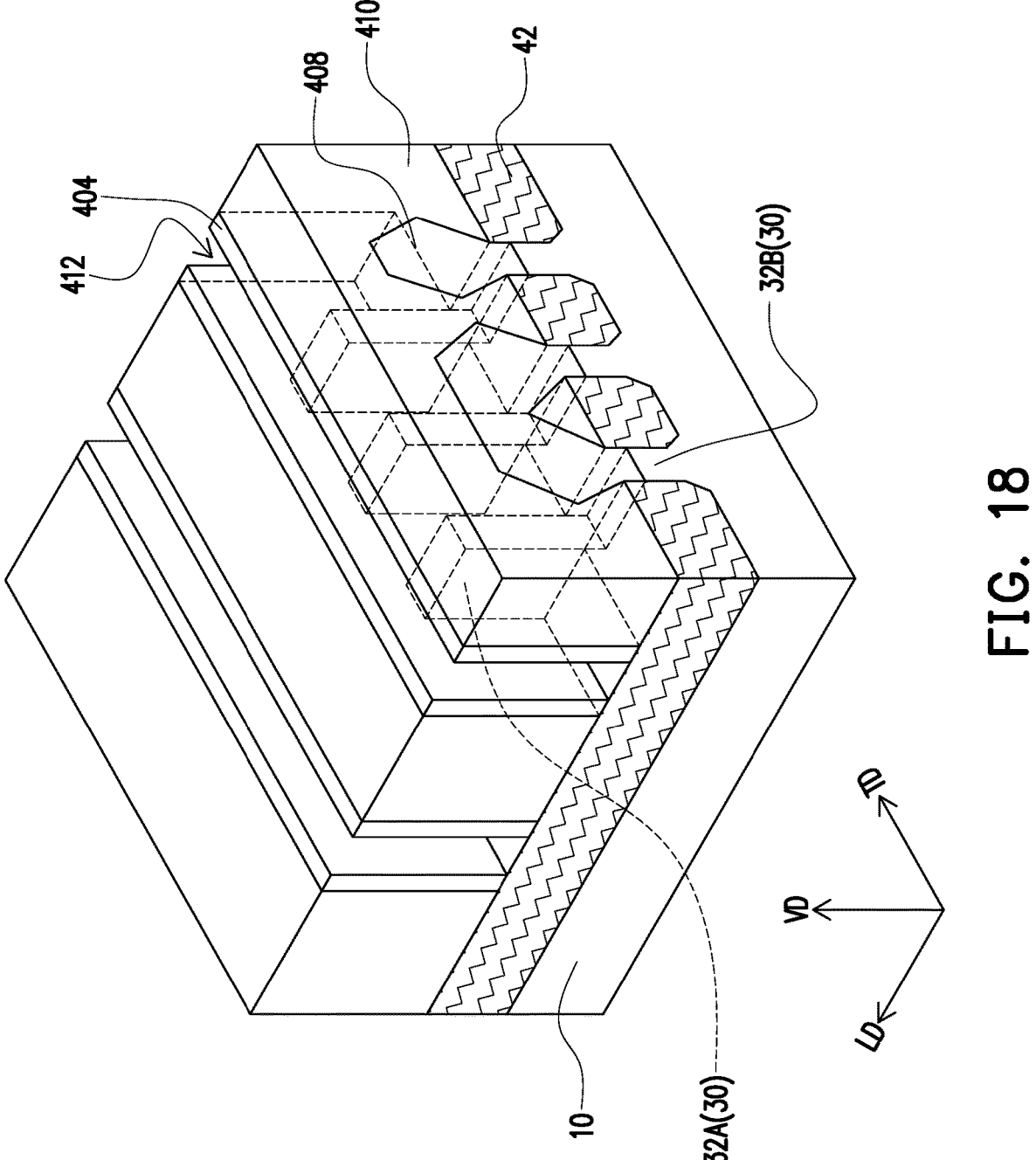

In FIG. 18, an inter-layer dielectric (ILD) 410 is formed. In addition, the dummy gate stacks 402 are etched, forming trenches 412 between gate spacers 404. The ILD 410 may include a dielectric material formed using, for example, FCVD, spin-on coating, CVD, or the like. The ILD 410 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. After the deposition of the dielectric material and before etching the dummy gate stacks 402, a planarization process such as a CMP process or a mechanical grinding process may be performed to level the top surfaces of the ILD 410, the dummy gate stacks 402, and the gate spacers 404 with each other. In the embodiments, the top surfaces and the sidewalls of the channel region 32A of the fin structures 30 (shown in dashed lines in FIG. 18 and may refer to FIG. 16) may be exposed to trenches 412.

Figure 19:
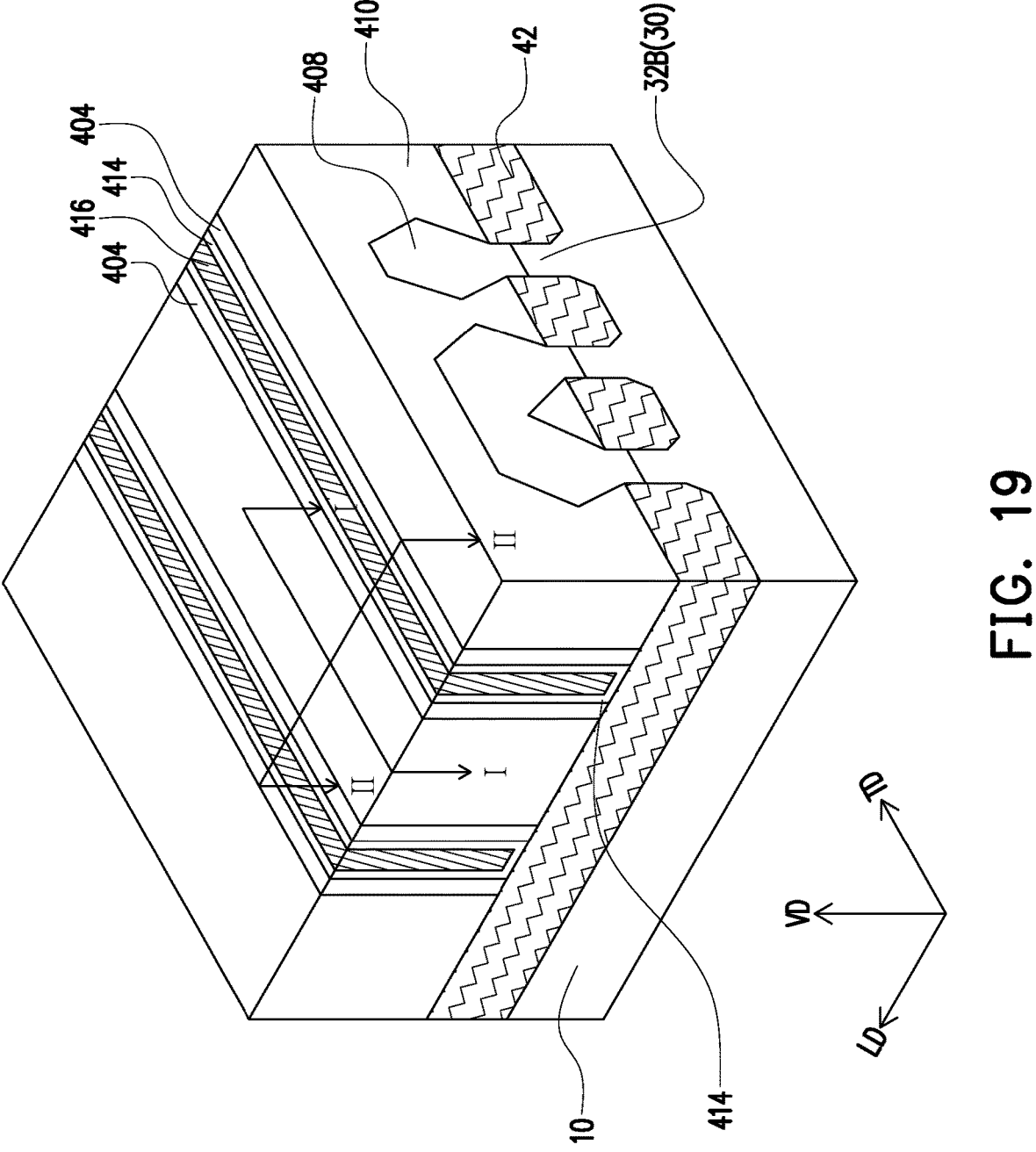

In FIG. 19, a high-k dielectric layer 414 is formed over ILD 410. The high-k dielectric layer 404 is formed as a conformal layer within the tranches 412 indicated in FIG. 18, and extends on the sidewalls of the gate spacers 404 and the top surfaces and the sidewalls of the channel region 32A of the fin structures 30 (refer to FIG. 16). In some embodiments, the high-k dielectric layer 414 is formed using ALD, CVD, PECVD, Molecular-Beam Deposition (MBD), or the like. The high-k dielectric layer 414 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher.

In addition, metal gate structures 416 are formed in the tranches 412 covered by the high-k dielectric layer 414 as shown in FIG. 19. For example, the metal gate structures 416 may include multiple functional layers and metal fill material. In some embodiments, work-function layers may include an n-work function layer, a p-work function layer, or a combination thereof. In some embodiments, contact structures connecting to the metal gate structures 416 and the epitaxy regions 408 may be further formed in the subsequent step to form a semiconductor device shown in FIGS. 20 and 21.

Figure 20:
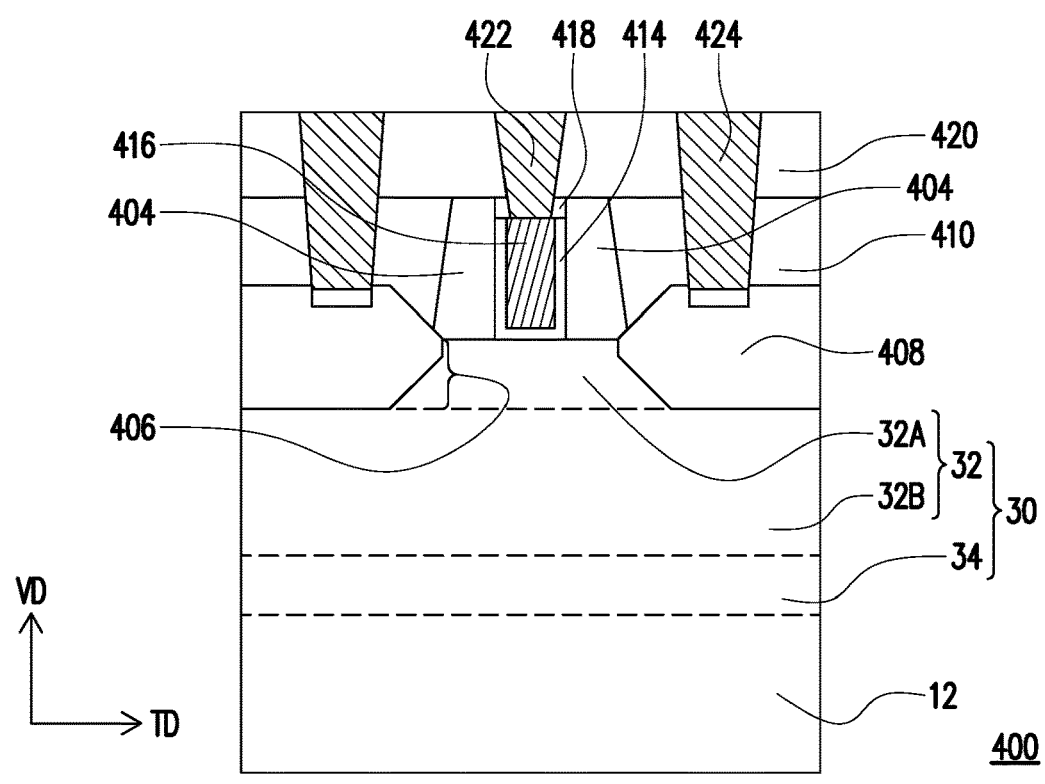
FIGS. 20 and 21 schematically illustrate cross sectional views of a semiconductor device in accordance with some embodiments of the disclosure.
Figure 21:
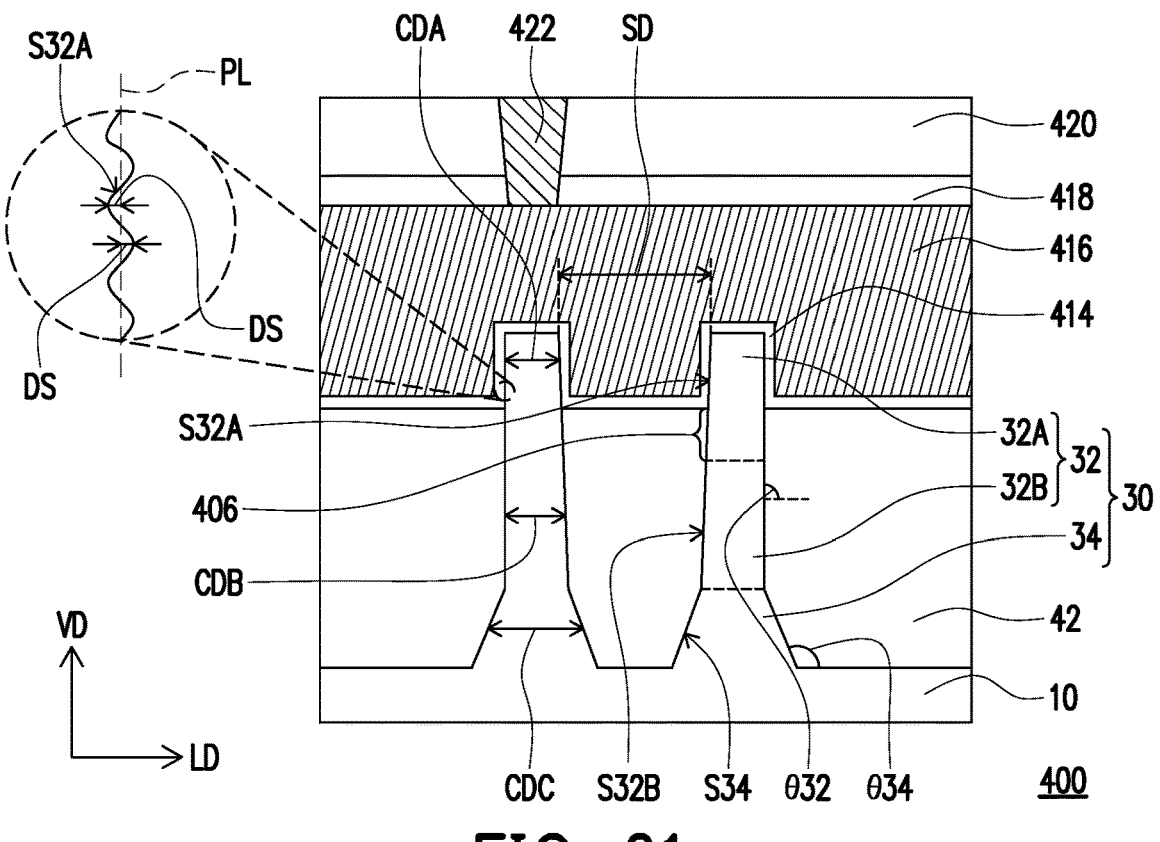

FIGS. 20 and 21 schematically illustrate cross sectional views of a semiconductor device in accordance with some embodiments of the disclosure. FIGS. 20 and 21 shows respective cross sectional views of a semiconductor device taken along the lines I-I, and II-II in FIG. 19. The line I-I in FIG. 19 may extend along one of the metal gate structures 416 and the line II-II in FIG. 19 may extend along one of the fin structures 30.

As shown in FIG. 20 and FIG. 21, the metal gate structure 416 may be partially removed, a hard mask 418 may be formed on the shortened metal gate structure 416, and another ILD 420 is formed covering the ILD 410 and the gate spacers 404 and the hark mask 418. In addition, gate contacts 422 and source/drain contacts 424 are formed through the ILD 420 and the ILD 410 in accordance with some embodiments. Openings for the source/drain contacts 424 are formed through the ILDs 410 and 420, and openings for the gate contact 422 are formed through the ILD 420. In some embodiments, a liner, such as a diffusion barrier layer, an adhesion layer, or the like, and a conductive material are formed in the openings for the contacts. The liner may include titanium, titanium nitride, tantalum, tantalum nitride, or the like. The conductive material may be copper, a copper alloy, silver, gold, tungsten, cobalt, aluminum, nickel, or the like. In some embodiments, a planarization process, such as a CMP, may be performed to remove excess material from a surface of the ILD 420. The remaining liner and conductive material form the source/drain contacts 424 and gate contacts 422 in the openings.

In some embodiments, an anneal process may be performed to form a silicide at the interface between the epitaxial regions 408 and the source/drain contacts 424. The source/drain contacts 424 are physically and electrically coupled to the epitaxial regions 408, and the gate contacts 422 are physically and electrically coupled to the metal gate structure 416. The source/drain contacts 424 and the gate contacts 422 may be formed in different processes, or may be formed in the same process. Although shown as being formed in the same cross-sections, it should be appreciated that each of the source/drain contacts 424 and gate contacts 422 may be formed in different cross-sections, which may avoid shorting of the contacts.

A semiconductor device 400 in FIGS. 20 and 21 includes the fin structures 30 arranged on the substrate 10, the trench isolation structure 42 surrounding the fin structures 30, the metal gate structure 416 disposed on the fin structures 30 and the epitaxy regions (source/drain regions) 408 disposed beside the metal gate structure 416 and connected to the fin structures 30. The metal gate structure 416 may be disposed between the gate spacers 404 and extend in the cross-fin direction TD. The high-k dielectric layer 414 may be disposed between the metal gate structure 416 and the gate spacers 404 as well as between the metal gate structure 416 and the fin structures 30. The ILD 410 may surround the gate spacers 404 and cover the epitaxy regions 408, and the ILD 420 may be disposed over the ILD 410. The tops of the ILD 410 and the gate spacers 404 may be at the same level. The gate contacts 422 and the source/drain contacts 424 extend through the ILD structure constructed by the ILD 410 and the ILD 420.

Figure 22:
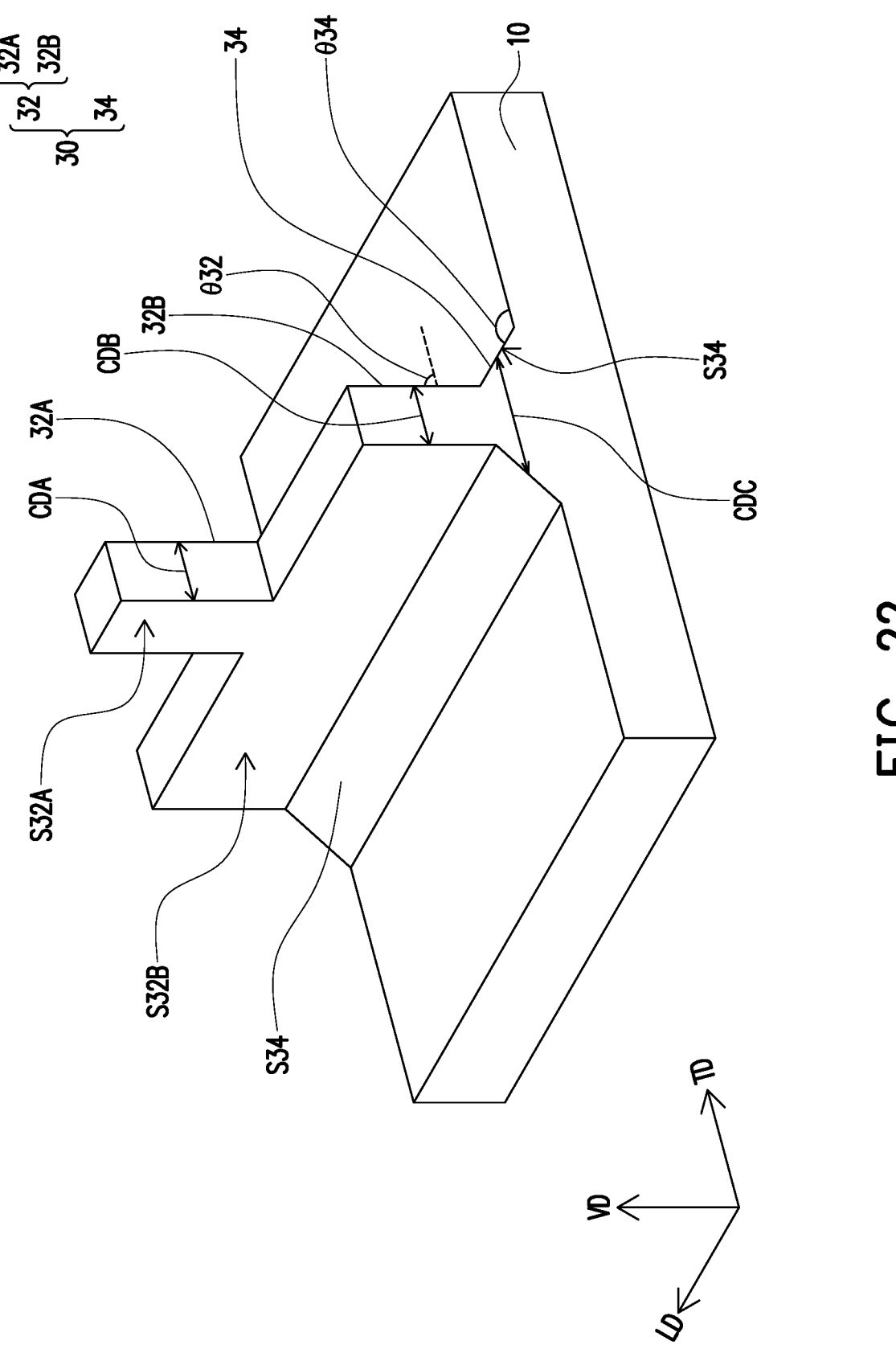
FIG. 22 schematically illustrates a fin structure of a semiconductor device in accordance with some embodiments of the disclosure.

FIG. 22 schematically illustrates a fin structure of a semiconductor device in accordance with some embodiments of the disclosure. Referring to FIGS. 20 to 22, the fin structures 30 may be formed by the steps and operations depicted in FIGS. 1 to 8 and may be an example of the fin structures 30P or 30N described in the previous embodiments. One or more of the fin structures 30 may include a ridge portion 32 and a bottom portion 34 below the ridge portion 32. The ridge portion 32 may be fabricated using the steps described in FIGS. 6 and 7 and the bottom portion may be fabricated using the steps described in FIG. 8, but further fabrication step may be adopted in some embodiments. In addition, the ridge portion 32 may be an implemental example of the ridge portions 32N and 32P in the previous embodiment. Accordingly, the descriptions regarding the ridge portions 32, 32N and 32P may be referred to one another.

The ridge portion 32 may include a channel region 32A and a fin region 32B arranged from top to bottom in sequence and the bottom portion 34 is under the fin region 32B. Accordingly, the fin portion 32B is located between the channel region 32A and the bottom portion 34. In some embodiments, the channel region 32A and the fin region 32B may be determined based on the bottom level of the epitaxy regions 408. Specifically, the channel region 32A is a section higher than the bottom level of the epitaxy regions 408 and the fin region 32B is a section lower than the bottom level of the epitaxy regions 408. In some embodiments, the bottom level of the epitaxy regions 408 may be lower than the level of the shallow trench isolation 42 since the epitaxy regions 408 are formed on the recesses 406 as depicted in FIG. 16. In addition, as shown in FIG. 22, the channel region 32A is protruded from the fin region 32B since the fin region 32B is formed by recessing the fin structure 30.

In some embodiments, the channel region 32A may be fabricated by using the step disclosed in FIG. 6 which mainly adopt the chlorine-based etching operation 302 for patterning the substrate 10. In some embodiments, a lower portion of the channel region 32A may optionally be fabricated using the step disclosed in FIG. 7 which mainly adopt the chlorine-based etching operation 302 and the fluorine-based etching operation 306 for patterning the substrate 10. In some embodiments, the fin region 32B may be fabricated by using the steps disclosed in FIG. 7 which mainly adopt the chlorine-based etching operation 302 and the fluorine-based etching operation 306 for patterning the substrate 10. In some embodiments, an upper portion of the fin region 32B may optionally be fabricated using the steps disclosed in FIG. 6 which mainly adopt the chlorine-based etching operation 302 for patterning the substrate 10.

The profile of the channel region 32A may have a smooth sidewall S32A that is covered by the high-K dielectric 414. In some embodiments, a roughness of the sidewall S32A may be referred to a distance DS from the physical outline of the sidewall S32A to a reference line PL and the distance DS is measured along the cross-fin direction TD, wherein the reference line PL is a photon line substantially extending in the vertical direction VD and is positioned corresponding to the predetermined outline of the corresponding structure. The distance DS from the physical outline of the sidewall S32A to the reference line PL measured at the channel region 32A may be from −0.6 nm to 0.3 nm, but the disclosure is not limited thereto.

In some embodiments, the channel region 32A may have a uniformed critical dimension CDA. In some embodiments, a difference of the critical dimensions CDA measured at different levels of the channel region 32A may be from −0.3 nm to 0.3 nm. In other words, the variation of critical dimension at the channel region 32A may by smaller than or equal to 0.3 nm, but the disclosure is not limited thereto. In some embodiments, a difference of the critical dimensions CDA of the channel region 32A measured at different levels may be from −0.2 nm to 0.2 nm when the fin structures 30 is a P-type fin structure and may be from −0.3 nm to 0.2 nm when the fin structures 30 is a N-type fin structure.

In some embodiments, the uniformity of the critical dimension CDA and the smooth sidewall S32A of the channel region 32A facilitate to improve the growth uniformity of the epitaxy regions 408, which improves the device performance of the semiconductor device 400. In some embodiments, the current leakage effect due to the roughness of the sidewalls S32A may be mitigated in the semiconductor device 400. In some embodiments, the uniformity of the critical dimension CDB and the sidewall roughness of the fin region 32B may be different from the channel region 32A. For example, a variation of the critical dimensions CDB measured at different levels of the fin region 32B may be different from that of the critical dimensions CDA and may be ranged outside −0.3 nm to 0.3 nm, but the disclosure is not limited thereto. In some embodiments, the sidewall roughness of the fin region 32B may be greater than the channel region 32A, but the disclosure is not limited thereto.

In some embodiments, the bottom portions 34 of the fin structures 30 may be fabricated using the steps depicted in FIG. 8 which adopts the modified chlorine-based etching operation 302' using the etchant gases $Cl_2$ and $NF_3$. The bottom portion 34 may have a taper sidewall S34 that is oblique with respect to the sidewall S32B of the fin region 32B and the sidewall S32A of the channel region 32A. In some embodiments, the taper sidewall S34 is included with the cross-fin direction TD by an angle θ34 which may be greater than about 100°, for example, from 107° to 110°, but the disclosure is not limited thereto. In some embodiments, the sidewall S32B of the fin region 32B and the sidewall S32A of the channel region 32A may be included with the cross-fin direction TD by an angle θ32 less than 100° and more proximate to 90°, for example 90°±2° or 90°±5°. In some embodiments, the angle θ32 may be to 92° to 95°. Accordingly, the ridge portion 32 have a vertical profile and the bottom portion 43 has a taper profile in the cross section taken along the cross-fin direction TD. The bottom portion 34 of one or more of the fin structures 30 may have a critical dimension CDC gradually increased toward the substrate 10. The critical dimension CDC is greater than the critical dimension CDB of the fin region 32B and also greater than the critical dimension CDA of the channel region 32A to provide a large base structure supporting the ridge portion 32. In some embodiments, the critical dimension CDB of the fin region 32B may be in a value between the critical dimension CDA of the channel region 32A and the critical dimension CDC of the bottom portion 34. In some embodiments, the critical dimension CDC may be 2 to 3 times or more of the critical dimension CDA and the critical dimension CDB may be 1.5 times or less of the critical dimension CDA, but the disclosure is not limited thereto. In addition, the taper sidewall S34 of the bottom portion 34 may have a roughness different from the sidewall S32A and S32B of the ridge portion 32 since etching operations for forming the bottom portion 34 and the ridge portion 32 are different. In some embodiments, the linearity of the fin structures 30 in the lengthwise directions LD of the fin structures 30 may be improved without obviously wiggle. For example, a variation of the space distance SD between two fin structures 30 measured at different portions in the lengthwise directions LD may be maintained within a small range and may be about 1.5 nm to 1.8 nm.

In accordance with some embodiments of the disclosure, the semiconductor device includes one or more of the fin structures including the ridge portion and the bottom portion below the ridge portion. The ridge portion may be formed by etching the fin structures through a process cycle including a chlorine-based etching operation followed by a passivating operation, wherein the chlorine-based etching operation may be fluorine free. The ridge portion of the fin structure have a smooth sidewall and desirable profile. The variation of the critical dimension of the ridge portion measured in the cross-fin direction of the fin structures is small to provide a uniformed dimension of the channel region so that the device performance may be ensured and/or improved. The bottom portion of the fin structure may have a large critical dimension to provide supporting effect to maintain the profile of the ridge portion and thus the fin structures have desirable profile without obviously wiggle. In some embodiments, the chlorine-based etching operation may be performed under large coil current and high power to control the distribution of the plasma so that the etching effect on different regions of the substrate may be more even to obtain the etched features with uniformed profiles at different regions.

In accordance with some embodiments, a semiconductor device includes a substrate; a fin structure arranged on the substrate and including a ridge portion and a bottom portion between the ridge portion and the substrate, wherein the ridge portion comprises a channel region and a fin region between the channel region and the bottom portion, a critical dimension of the bottom portion in a cross-fin direction is gradually increased toward the substrate to twice or more of a critical dimension of the channel region in the cross-fin direction; a metal gate structure disposed on the fin structure extending the cross-fin direction; and an epitaxy region disposed beside the metal gate structure in a lengthwise direction of the fin structure and connected to the fin structure. The critical dimension of the fin region in the cross-fin direction may be greater than the critical dimension of the channel region in the cross-fin direction. The critical dimension of the fin region in the cross-fin direction may be 1.5 times or less of the critical dimension of the channel region in the cross-fin direction. The bottom portion has a taper sidewall included with the cross-fin direction by an angle greater than 100°, wherein the angle is from 107° to 110°. The fin region is lower than a bottom of the epitaxy region. A material of the channel region is different from the substrate.

In accordance with some embodiments, a semiconductor device includes a substrate; a plurality of fin structures arranged on the substrate and one or more of the fin structures including a ridge portion and a bottom portion between the ridge portion and the substrate, wherein a critical dimension of the bottom portion in a cross-fin direction is gradually increased toward the substrate to be greater than a critical dimension of the ridge portion in the cross-fin direction; a dielectric fin structure disposed between two of the fin structures in the cross-fin direction; and a shallow trench isolation disposed between the dielectric fin structure and the fin structures, wherein a material of the dielectric fin structure is different from the shallow trench isolation. The bottom portion has a taper sidewall included with the cross-fin direction by an angle greater than 100°, wherein the angle is from 107° to 110°. An upper portion of the dielectric fin structure and upper portions of the fin structures are protruded from the shallow trench isolation. The shallow trench isolation comprises sub-layers conforming to an outline of the fin structures.

In accordance with some embodiments, a method of fabricating a semiconductor device includes patterning a substrate to form a ridge portion under a main etching stage of a fin process, wherein the main etching stage includes performing a first process cycle a number of times followed by performing a second process cycle a number of times, the first process cycle includes performing a chlorine-based etching operation and a passivating operation in sequence, and the second process cycle includes performing the chlorine-based etching operation, a fluorine-based etching operation and the passivating operation in sequence; and patterning the substrate to form a bottom portion below the ridge portion to form a fin structure under a bottom etching stage of the fin process. A third process cycle during the bottom etching stage includes performing a modified chlorine-based etching operation and a passivating operation in sequence, and the modified chlorine-based etching operation adopts an etchant gas different from the chlorine-based etching operation. The etchant gas of the modified chlorine-based etching operation and the chlorine-based etching operation comprises $Cl_2$. The etchant gas of the modified chlorine-based etching operation further comprises $NF_3$. The chlorine-based etching operation is fluorine free. The passivating operation in a first time of the first process cycle adopts two passivating gases alternately. An etched feature is formed during the first process cycle and the etched feature is covered by a passivating layer during the second process cycle. An epitaxial layer embedded in the substrate is further formed before patterning the substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprises:
a substrate;
a plurality of fin structures arranged on the substrate and one or more of the fin structures including a ridge portion and a bottom portion between the ridge portion and the substrate, wherein a critical dimension of the bottom portion in a cross-fin direction is gradually increased toward the substrate to be greater than a critical dimension of the ridge portion in the cross-fin direction;
a dielectric fin structure disposed between two of the fin structures in the cross-fin direction and bottoms of the two of the fin structures are at different vertical levels; and
a shallow trench isolation isolating the dielectric fin structure from the substrate and the fin structures, wherein a material of the dielectric fin structure is different from the shallow trench isolation.

2. The semiconductor device of claim 1, wherein the bottom portion has a taper sidewall included with the cross-fin direction by an angle greater than 100°.

3. The semiconductor device of claim 2, wherein the angle is from 107° to 110°.

4. The semiconductor device of claim 1, wherein an upper portion of the dielectric fin structure and upper portions of the fin structures are protruded from the shallow trench isolation.

5. The semiconductor device of claim 1, wherein the shallow trench isolation comprises sub-layers conforming to an outline of the fin structures.

6. The semiconductor device of claim 1, wherein the one or more of the fin structures includes an epitaxial section and an intrinsic section under the epitaxial section and the epitaxial section is of the material different from the intrinsic section.

7. The semiconductor device of claim 1, wherein the one or more of the fin structures extends discontinuously along a lengthwise direction intersecting with the cross-fin direction.

8. The semiconductor device of claim 1, further comprising an isolation patten disposed at a discontinued portion of the one or more of the fin structures.

9. The semiconductor device of claim 8, wherein a top of the isolation pattern is coplanar to a top of the shallow trench isolation.

10. A semiconductor device, comprises:
a substrate;
a plurality of fin structures arranged on the substrate;
a dielectric fin structure disposed between a first fin structure of the fin structures and a second fin structure of the fin structures; and
a shallow trench isolation isolating the dielectric fin structure from the substrate and the fin structures, wherein a material of the dielectric fin structure is different from the shallow trench isolation, the shallow trench isolation includes U-shape structures, and the dielectric fin structure is wrapped by one of the U-shape structures, and wherein a bottom surface of the one of the U-shape structures in contact with the substrate obliquely extends from the first fin structure at a first vertical level to the second fin structure at a second vertical level different from the first vertical level.

11. The semiconductor device of claim 10, wherein each of the fin structures is disposed between two of the U-shape structures.

12. The semiconductor device of claim 10, wherein one or more of the fin structures includes an epitaxial section and an intrinsic section under the epitaxial section and the epitaxial section is of the material different from the intrinsic section.

13. The semiconductor device of claim 10, wherein a critical dimension of a bottom portion of the one or more of the fin structures in a cross-fin direction is gradually increased toward the substrate.

14. The semiconductor device of claim 13, wherein the bottom portion has a taper sidewall included with the cross-fin direction by an angle greater than 100°.

15. The semiconductor device of claim 10, wherein an upper portion of the dielectric fin structure and upper portions of the fin structures are protruded from the shallow trench isolation.

16. The semiconductor device of claim 10, further comprising an isolation pattern disposed between two of the U-shape structure of the shallow trench isolation and extends along one of the fin structures.

17. A semiconductor device, comprises:
a substrate;
a first fin structure disposed on the substrate and including a ridge portion and a bottom portion between the ridge portion and the substrate, wherein a critical dimension of the bottom portion in a cross-fin direction is gradually increased toward the substrate to be greater than a critical dimension of the ridge portion in the cross-fin direction;
a second fin structure disposed on the substrate, and having a different conductive type from the first fin structure;

a dielectric fin structure disposed between the first fin structure and the second fin structure in the cross-fin direction, a bottom portion of the dielectric fin structure having a dimension in the cross-fin direction being gradually reduced toward the substrate; and a shallow trench isolation isolating the dielectric fin structure from the substrate, the first fin structure and the second fin structure, wherein a material of the dielectric fin structure is different from the shallow trench isolation.

18. The semiconductor device of claim 17, wherein the shallow trench isolation includes a U-shape structures, and the dielectric fin structure is wrapped by the U-shape structure.

19. The semiconductor device of claim 17, further comprising an isolation pattern extends along discontinuations of the first fin structure.

20. The semiconductor device of claim 17, wherein a bottom of the first fin structure being at a first vertical level and a bottom of the second fin structure being at a second vertical level different from the first vertical level.

\* \* \* \* \*